(12) United States Patent
Lin et al.

(10) Patent No.: US 10,866,504 B2
(45) Date of Patent: Dec. 15, 2020

(54) LITHOGRAPHY MASK WITH A BLACK BORDER REGION AND METHOD OF FABRICATING THE SAME

(71) Applicant: Taiwan Semiconductor Manufacturing Co., Ltd., Hsinchu (TW)

(72) Inventors: Chin-Hsiang Lin, Hsinchu (TW); Chien-Cheng Chen, Hsinchu County (TW); Hsin-Chang Lee, Hsinchu County (TW); Chia-Jen Chen, Hsinchu County (TW); Pei-Cheng Hsu, Taipei (TW); Yih-Chen Su, Taichung (TW); Gaston Lee, Hsinchu County (TW); Tran-Hui Shen, Yunlin County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 79 days.

(21) Appl. No.: 15/851,829

(22) Filed: Dec. 22, 2017

(65) Prior Publication Data
US 2019/0196322 A1   Jun. 27, 2019

(51) Int. Cl.
| | |
|---|---|
| *G03F 1/24* | (2012.01) |
| *G03F 1/38* | (2012.01) |
| *G03F 7/20* | (2006.01) |
| *G03F 1/54* | (2012.01) |
| *G03F 1/22* | (2012.01) |

(52) U.S. Cl.
CPC .................. *G03F 1/24* (2013.01); *G03F 1/38* (2013.01); *G03F 1/54* (2013.01); *G03F 7/2004* (2013.01); *G03F 1/22* (2013.01)

(58) Field of Classification Search
CPC ..................................................... G03F 7/2004
USPC ............................................................. 430/5
See application file for complete search history.

(56) References Cited

U.S. PATENT DOCUMENTS

| | | | |
|---|---|---|---|
| 7,517,804 B2 * | 4/2009 | Kiehlbauch | H01L 21/31116 216/80 |
| 8,628,897 B1 | 1/2014 | Lu et al. | |
| 8,679,707 B2 | 3/2014 | Lee et al. | |
| 8,691,476 B2 | 4/2014 | Yu et al. | |

(Continued)

FOREIGN PATENT DOCUMENTS

| | | |
|---|---|---|
| TW | 201015208 A | 4/2010 |
| TW | 201614362 A | 4/2016 |

*Primary Examiner* — Daborah Chacko-Davis
(74) *Attorney, Agent, or Firm* — Haynes and Boone, LLP

(57) ABSTRACT

A lithography mask includes a substrate, a reflective structure disposed over a first side of the substrate, and a patterned absorber layer disposed over the reflective structure. The lithography mask includes a first region and a second region that surrounds the first region in a top view. The patterned absorber layer is located in the first region. A substantially non-reflective material is located in the second region. The lithography mask is formed by forming a reflective structure over a substrate, forming an absorber layer over the reflective structure, defining a first region of the lithography mask, and defining a second region of the lithography mask. The defining of the first region includes patterning the absorber layer. The second region is defined to surround the first region in a top view. The defining of the second region includes forming a substantially non-reflective material in the second region.

20 Claims, 31 Drawing Sheets

(56) References Cited

U.S. PATENT DOCUMENTS

| | | |
|---|---|---|
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |
| 8,916,482 B2 * | 12/2014 | Lee .......................... G03F 1/76 438/763 |
| 2009/0220869 A1 * | 9/2009 | Takai .................... B82Y 10/00 430/5 |
| 2009/0233188 A1 * | 9/2009 | Amano .................. B82Y 10/00 430/5 |
| 2011/0165504 A1 | 7/2011 | Ikuta |
| 2013/0202992 A1 | 8/2013 | Chen et al. |
| 2014/0017817 A1 * | 1/2014 | Godet .................... H01L 43/12 438/3 |
| 2014/0111781 A1 * | 4/2014 | Chang ................. G03F 7/70916 355/30 |
| 2015/0286146 A1 | 10/2015 | Chang et al. |
| 2015/0309405 A1 | 10/2015 | Shih et al. |
| 2015/0311075 A1 | 10/2015 | Huang et al. |
| 2017/0038671 A1 | 2/2017 | Takai |
| 2017/0263444 A1 | 9/2017 | Shoki et al. |

\* cited by examiner

US 10,866,504 B2

LITHOGRAPHY MASK WITH A BLACK BORDER REGION AND METHOD OF FABRICATING THE SAME

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As the semiconductor device sizes continue to shrink, for example below 20 nanometer (nm) nodes, traditional lithography technologies have optical restrictions, which leads to resolution issues and may not achieve the desired lithography performance. In comparison, extreme ultraviolet (EUV) lithography can achieve much smaller device sizes. However, existing EUV lithography may still have shortcomings, for example shortcomings related to field-to-field interferences in wafer printing.

Therefore, while existing lithography systems and methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
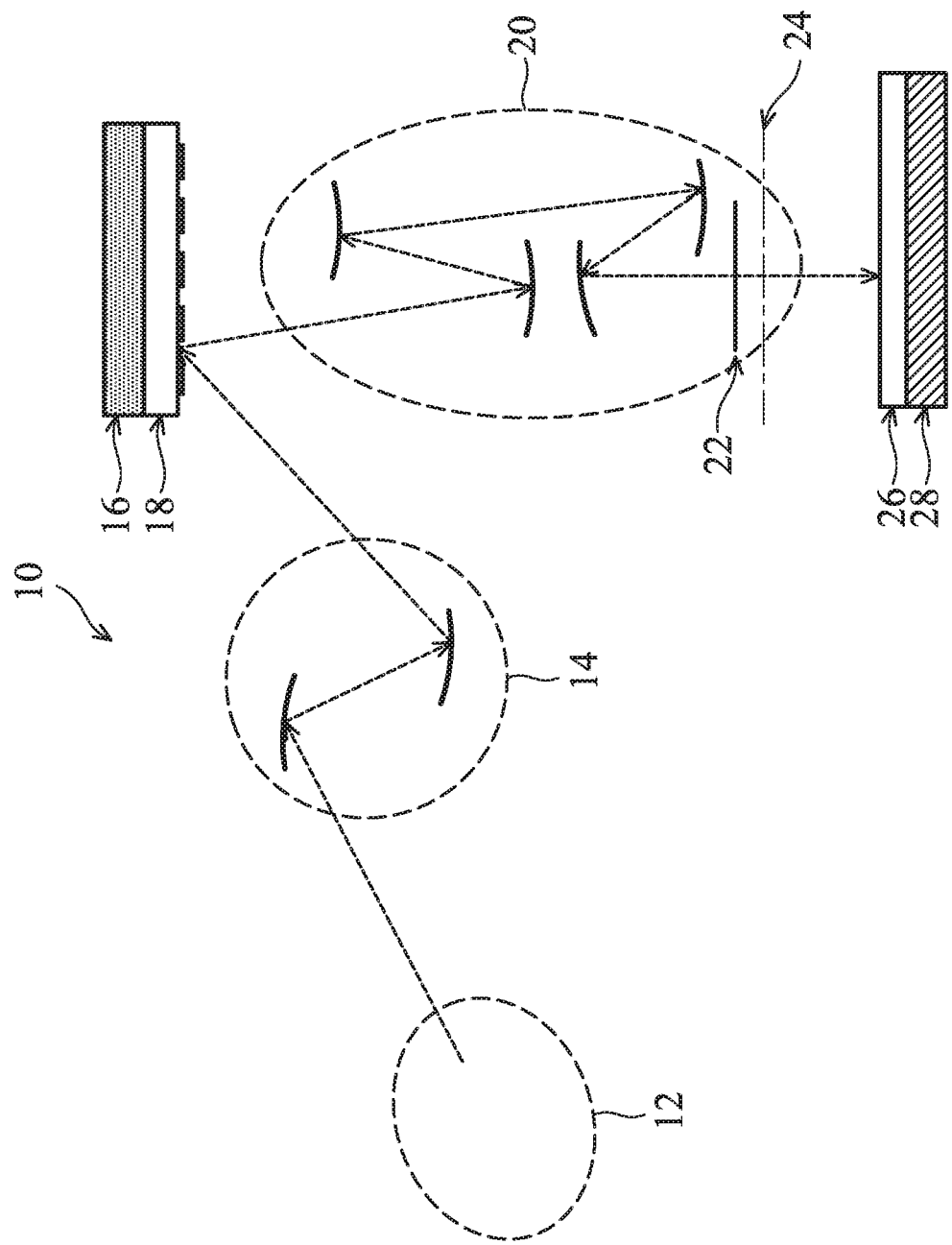
FIG. 1 is a schematic view of a lithography system constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet (EUV) lithography has become widely used due to its ability to achieve small semiconductor device sizes. However, conventional systems and methods of performing EUV lithography may have shortcomings. For example, conventional EUV systems employ a lithography mask configured to perform EUV lithography. The EUV lithography mask includes a region—which may be referred to as a "main field"—that has patterns for defining the various integrated circuit (IC) features in lithography. However, one problem related to conventional EUV lithography is field-to-field interference in wafer printing. For example, if areas near the edges of the "main field" region have non-zero reflectivity with respect to EUV light, that may lead to critical dimension (CD) problems at the edges of a resulting IC die and/or a neighboring IC die. Consequently, semiconductor device performance is degraded.

To reduce or eliminate the field-to-field interference problem, the present disclosure forms a border region surrounding the "main field" region, where the border region is non-reflective, for example non-reflective with respect to light in the EUV spectrum. This border region may also be referred to as a "black border" region. The various aspects of the present disclosure will be discussed below in greater detail with reference to FIGS. 1-30. First, a EUV lithography system is discussed below with reference to FIG. 1. Next, the details of the EUV mask according to embodiments of the present disclosure are discussed with reference to FIGS. 2-30.

FIG. 1 is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates a EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence σ being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence σ of at most 0.3 in some embodiments.

The lithography system 10 also includes a mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is a EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion. In some embodiments, the LTEM includes 5%-20% by weight $TiO_2$ and has a thermal coefficient of expansion lower than about $1.0\times10^{-6}/°$ C. For example, in some embodiments, the $TiO_2$ doped $SiO_2$ material of the LTEM has a coefficient thermal expansion such that it varies by less than 60 parts-per-billion for every 1 degree Celsius of temperature change. Of course, other suitable materials having thermal coefficient of expansion that is equal to or less than $TiO_2$ doped $SiO_2$ may also be used.

The mask 18 also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer deposited over the ML. The absorption layer is patterned to define a layer of an integrated circuit (IC). Alternatively, another reflective layer may be deposited over the ML and is patterned to define a layer of an integrated circuit, thereby forming a EUV phase shift mask.

The lithography system 10 also includes a projection optics module (or projection optics box (POB) 20 for imaging the pattern of the mask 18 on to a target 26 (e.g., a semiconductor substrate) secured on a substrate stage 28 of the lithography system 10. The POB 20 has refractive optics (such as for UV lithography system) or alternatively reflective optics (such as for EUV lithography system) in various embodiments. The light directed from the mask 18, diffracted into various diffraction orders and carrying the image of the pattern defined on the mask, is collected by the POB 20. The POB 20 may include a magnification of less than one (thereby the size of the "image" on a target (such as target 26 discussed below) is smaller than the size of the corresponding "object" on the mask). The illuminator 14 and the POB 20 are collectively referred to as an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane 24. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as an EUV lithography system) since all materials absorb EUV light.

As discussed above, the lithography system 10 also includes the substrate stage 28 to secure a target 26 to be patterned, such as a semiconductor substrate. In the present embodiment, the semiconductor substrate is a semiconductor wafer, such as a silicon wafer or other type of wafer. The target 26 is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
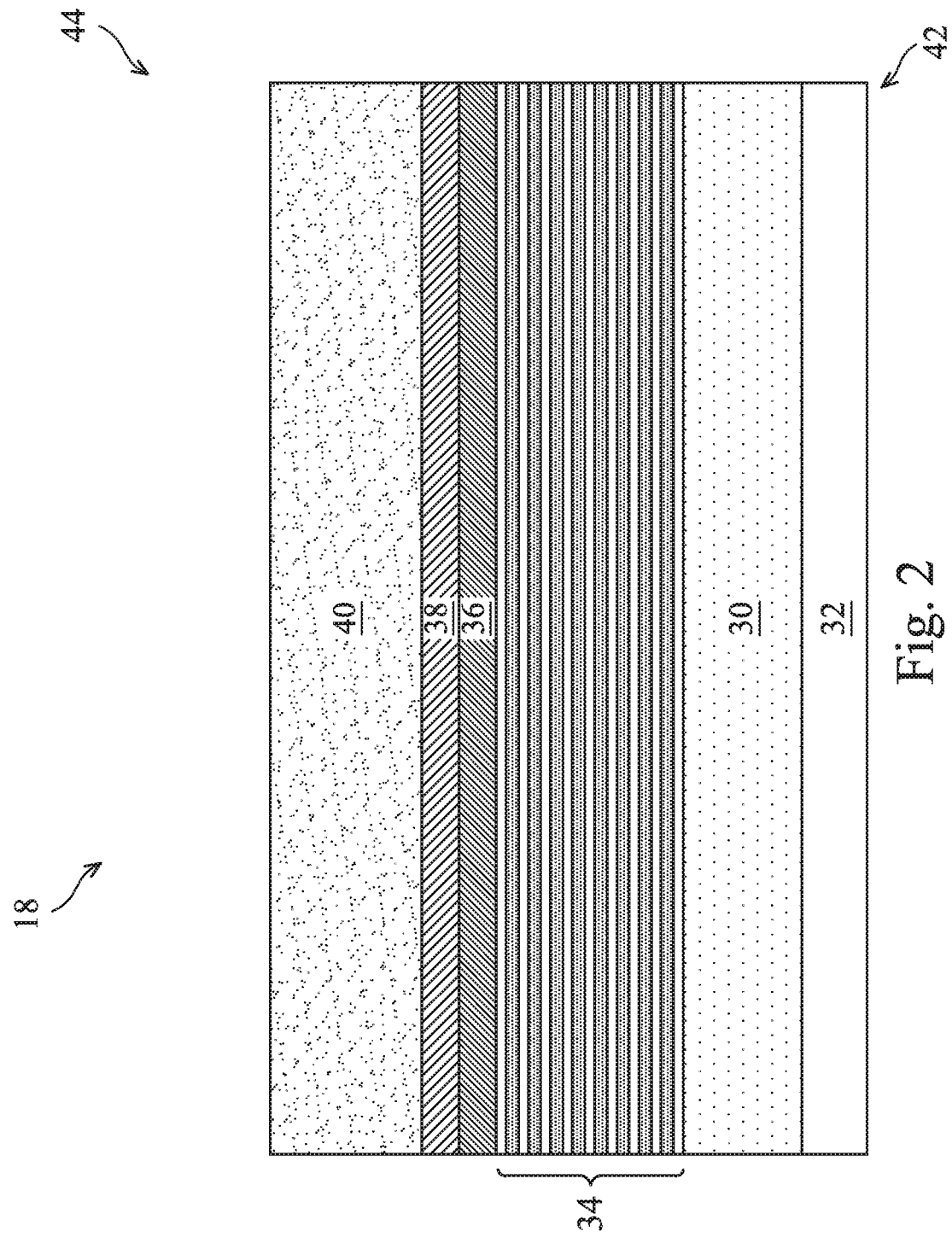
FIGS. 2-26 illustrate cross-sectional views of a lithography mask at various stages of fabrication according to embodiments of the present disclosure.

FIGS. 2-9 are diagrammatic fragmentary cross-sectional side views of a lithography mask at various stages of fabrication according to one embodiment of the present disclosure. Referring to FIG. 2, the EUV lithography mask 18 in FIG. 1 is illustrated in more detail. The EUV lithography mask 18 includes a substrate 30 made of a LTEM. The LTEM may include $TiO_2$ doped $SiO_2$, and/or other low thermal expansion materials known in the art. In some embodiments, a conductive layer 32 is additionally disposed under on a side 42 (also referred to as a backside) of the LTEM substrate 30 for the electrostatic chucking purpose. In one example, the conductive layer 32 includes chromium nitride (CrN). In other embodiments, other suitable compositions are possible, such as a tantalum-containing material.

The EUV mask 18 includes a reflective multilayer (ML) structure 34 disposed over a side 44 (also referred to as a front side) of the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 18 also includes a capping layer 36 disposed over the ML structure 34 to prevent oxidation of the ML. In one embodiment, the capping layer 36 includes silicon with a thickness ranging from about 4 nm to about 7 nm. The EUV mask 18 may further include a buffer layer 38 disposed above the capping layer 36 to serve as an etching-stop layer in a patterning or repairing process of an absorption layer, which will be described later. The buffer layer 38 has different etching characteristics from the absorber layer disposed thereabove. The buffer layer 38 includes ruthenium (Ru), Ru compounds such as RuB, RuSi, chromium (Cr), chromium oxide, and chromium nitride in various examples.

The EUV mask 18 also includes an absorber layer 40 (also referred to as an absorption layer) formed over the buffer layer 38. In some embodiments, the absorber layer 40 absorbs the EUV radiation directed onto the EUV mask 18. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actinium, Radium, Tellurium, Zinc, Copper, and Aluminum.

Figure 3:
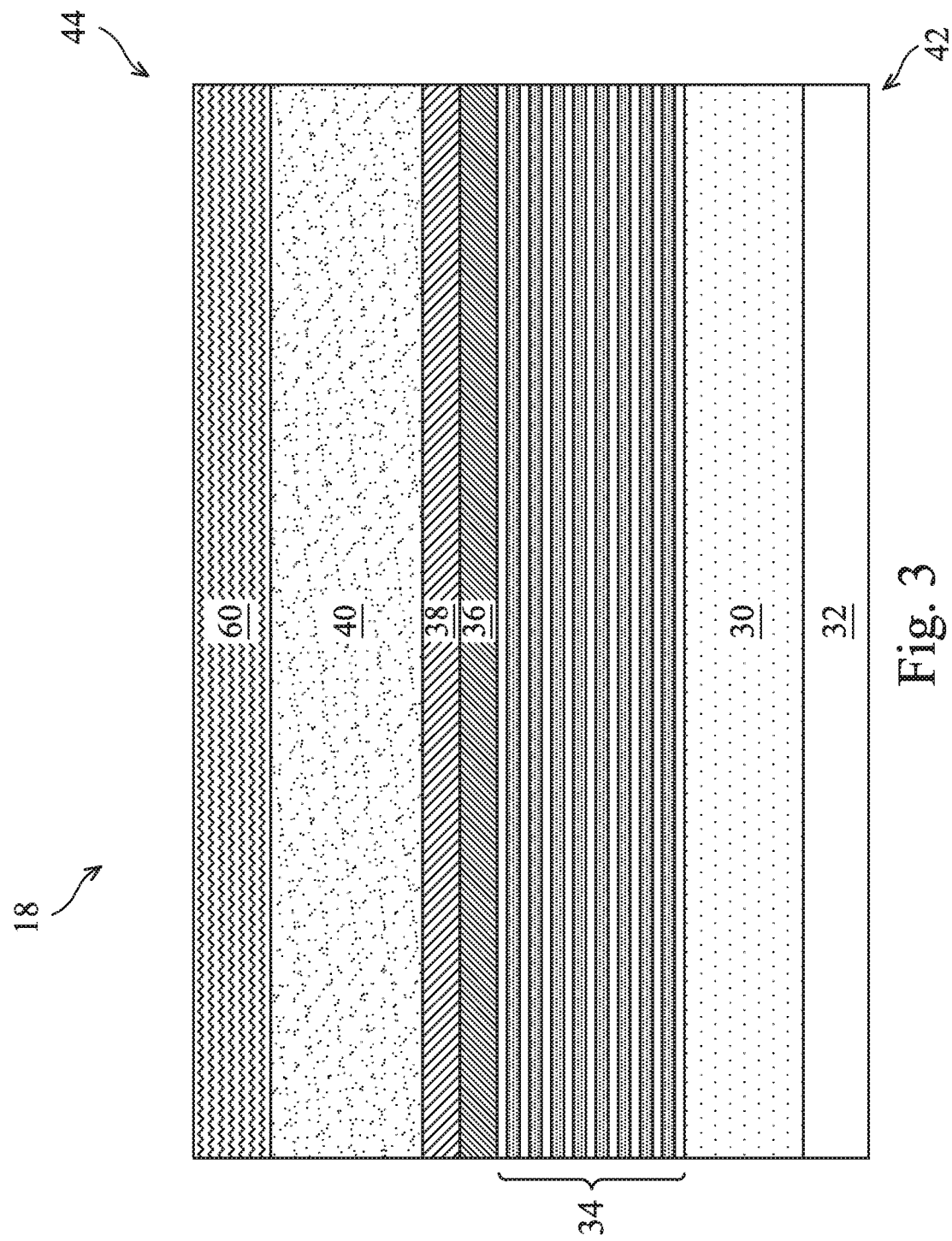

Referring now to FIG. 3, a photoresist layer 60 is formed over the absorber layer 40. The photoresist layer 60 may be a EUV photoresist (e.g., sensitive to radiation in the EUV range). In some embodiments, the photoresist layer 60 may be formed by a spin-coating process.

Figure 4:
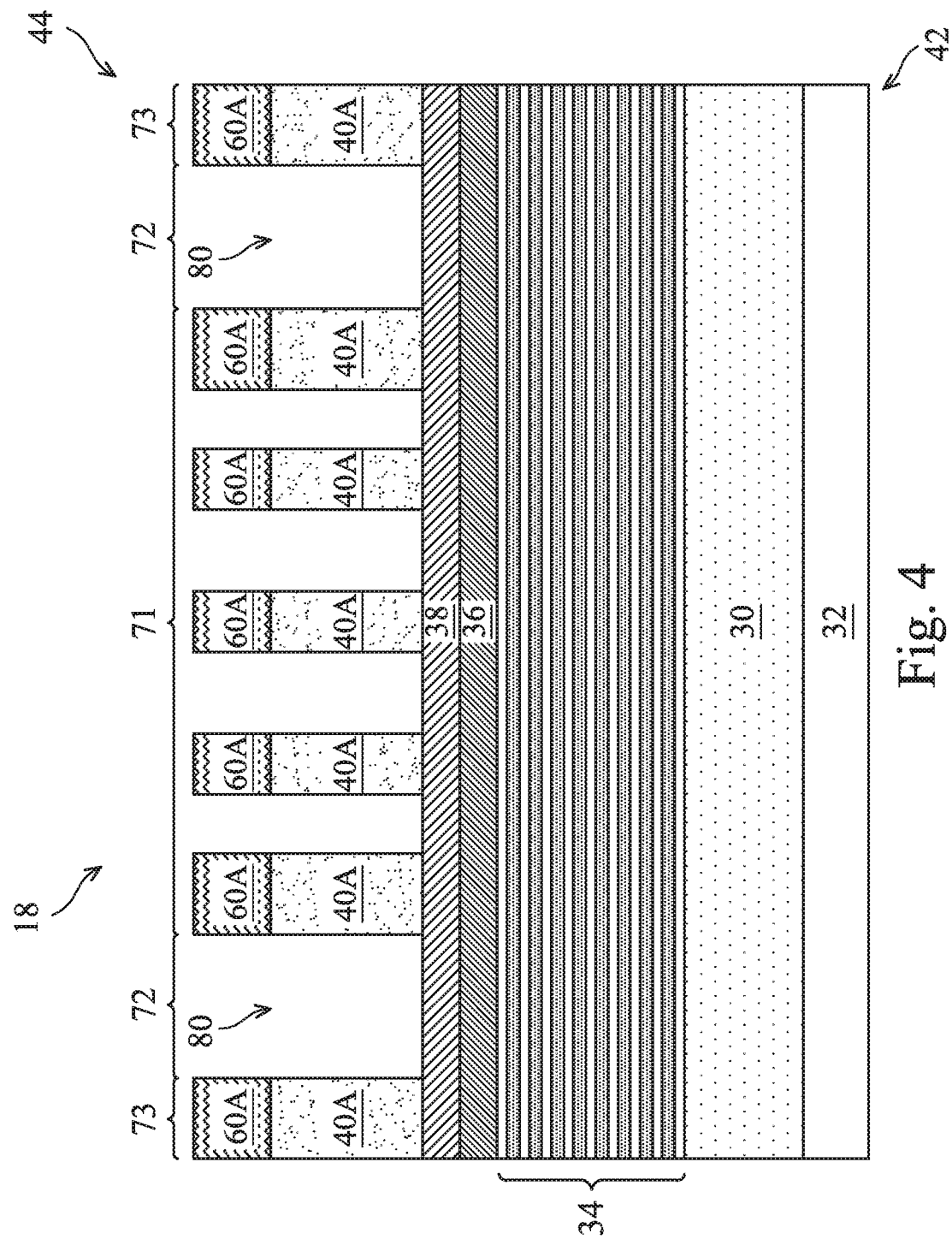

Referring now to FIG. 4, the photoresist layer 60 is patterned to form a patterned photoresist layer 60A. In some embodiments, the patterning of the photoresist layer 60 may include an electron beam (E-beam) exposure process. The absorber layer 40 is then etched, with the patterned photoresist layer 60A serving as an etching mask. A patterned absorber layer 40A is formed as a result.

Still referring to FIG. 4, the EUV mask 18 includes three regions: a region 71, a region 72, and a region 73. Portions of the patterned absorber layer 40A are located in the region 71 of the EUV mask 18. The region 71 may be referred to as a "main field" of the EUV mask 18, and the patterned absorber layer 40A located in the "main field" region 71 may be used to define IC features on a wafer in a later process.

The region 72 surrounds the region 71 in a top view (illustrated in FIGS. 27-29 and discussed in further detail below). The region 72 may serve as a "border" for the "main field' region 71 of the EUV mask 18. According to various aspects of the present disclosure, it is desirable to keep the "border" region 72 substantially non-reflective with respect to EUV light. As such, the region 72 may also be referred to as "black border" region. In the embodiment illustrated in FIG. 4, trenches (or recesses) 80 are formed in the absorber layer 40, where the location of the trenches 80 corresponds to the region 72 of the EUV mask 18.

The region 73 surrounds the region 72 in a top view and includes a rest of the EUV mask 18 outside of the "main field" region 71 and the "black border" region 72. The region 73 may not be specifically configured to be non-reflective with respect to EUV light, and thus the region 73 may have a greater EUV reflectivity than the region 72.

Figure 5:
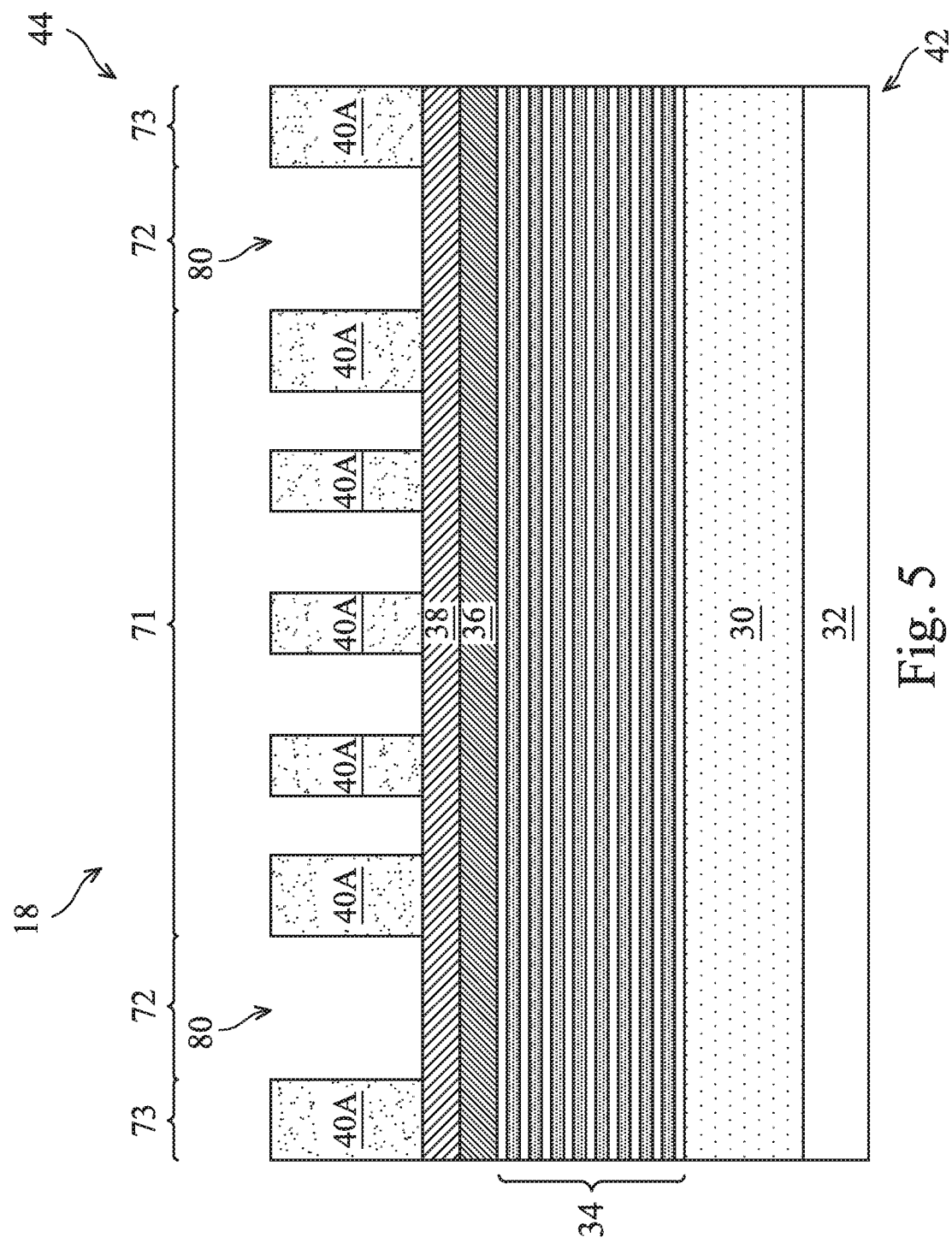

Referring now to FIG. 5, the patterned photoresist layer 60A is removed, for example using a photoresist ashing process or a photoresist stripping process. The patterned absorber layer 40A is now exposed.

Figure 6:
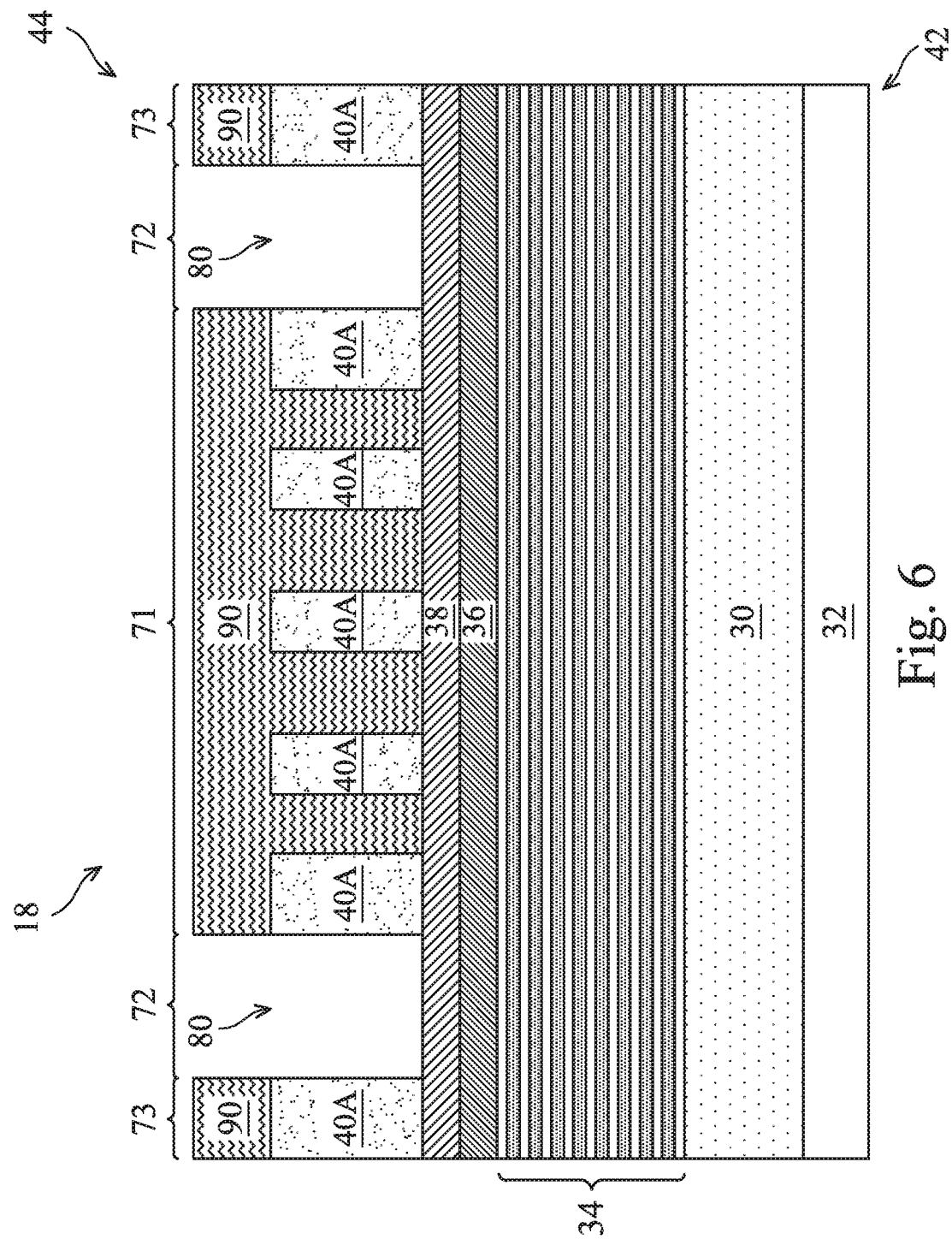

Referring now to FIG. 6, a patterned photoresist layer 90 is formed over the patterned absorber layer 40A in the regions 71 and 73 of the EUV mask 18, but not in the region 72. In other words, the trenches 80 corresponding to the region 72 of the EUV mask 18 are still exposed, but the rest of the EUV mask 18 is covered or protected by the patterned photoresist layer 90.

Figure 7:
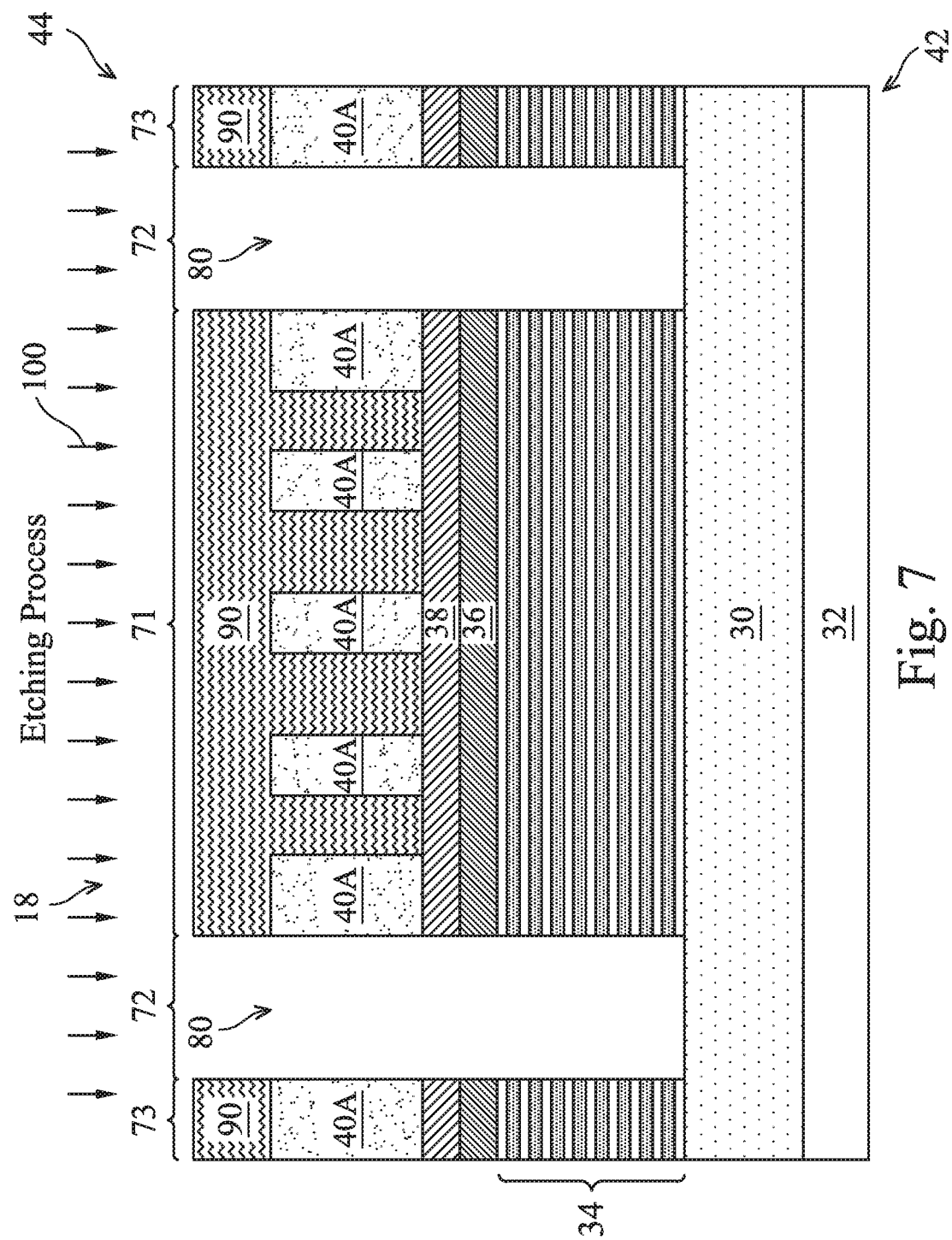

Referring now to FIG. 7, an etching process 100 is performed to the EUV mask 18 from the side 44. The patterned photoresist layer 90 serves as a protecting layer during the etching process 100, so as to protect the layers located therebelow from being etched. Meanwhile, the etching process 100 etches away portions of the layers 36 and 38 and the ML structure 34. As a result, the trenches 80 are extended downwardly (from the side 44 toward the side 42) and through the layers 36-38 and the ML structure 34. The etching process 100 stops when the LTEM substrate 30 is reached, and thus portions of the LTEM substrate 30 are exposed by the trenches 80.

As discussed above, it is desirable to keep the region 72 non-reflective with respect to EUV light, and the removal of the ML structure 34 in the region 72 helps achieve this objective, since the absence of the ML structure 34 in the region 72 means that the region 72 now has no light-reflective material.

Figure 8:
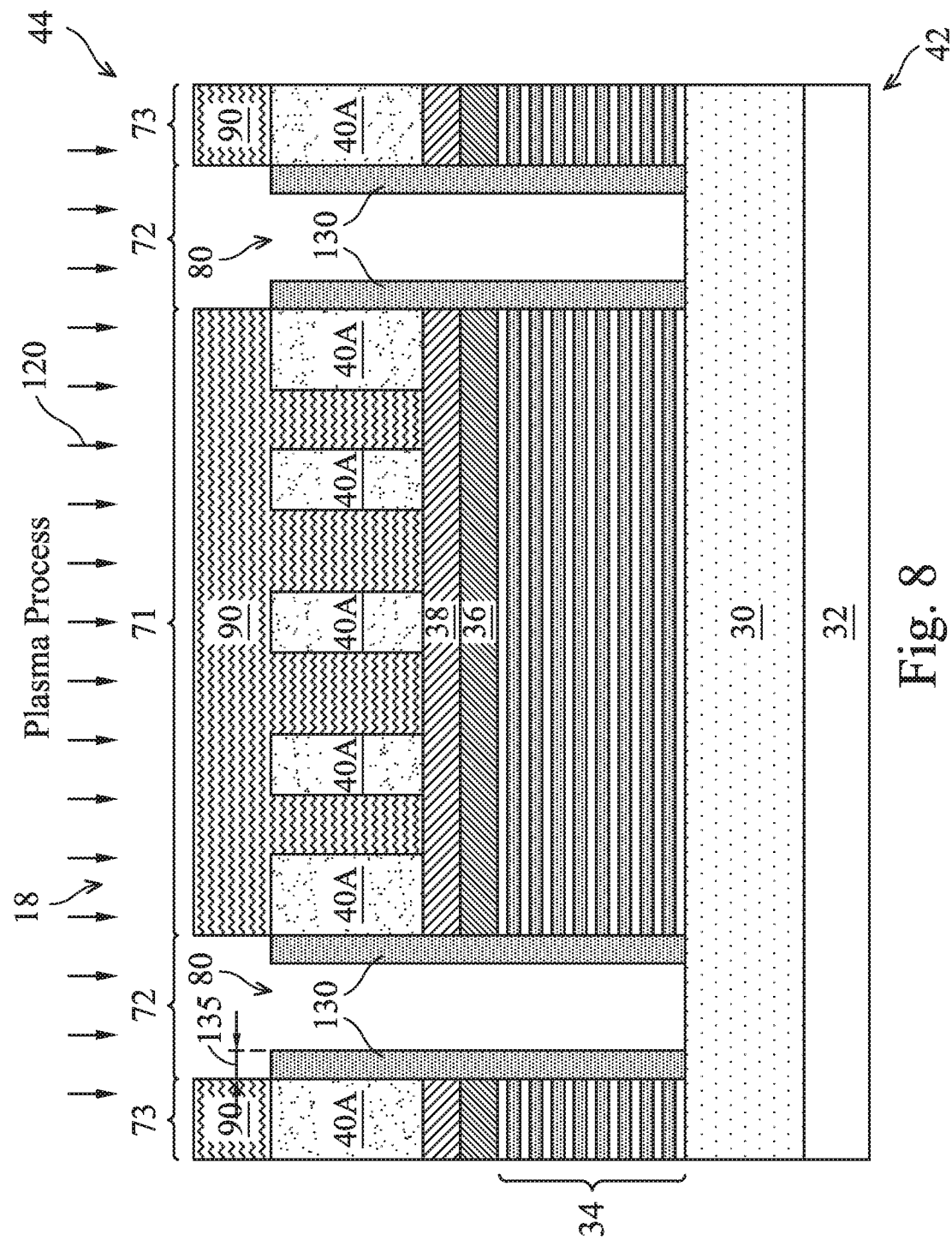

Referring now to FIG. 8, a plasma process 120 is performed to the EUV mask 18. In some embodiments, the etching process 100 and the plasma process 120 are performed in the same chamber. In some embodiments, the plasma process 120 involves using an oxygen plasma. In other embodiments, the plasma process 120 involves using a nitrogen plasma. In some embodiments, the plasma process 120 is performed with the following process parameters: a temperature in a range between about 200 degrees Kelvin and about 400 degrees Kelvin, a pressure in a range between about 0.5 milli-Torrs (mT) and about 10 mT, a source power in a range between about 100 watts and about 600 watts, a bias power in a range between about 5 volts and about 50 volts, a flow rate (for either oxygen or nitrogen) in a range between about 50 standard cubic centimeter per minute (sccm) and about 400 sccm, and a period in a range between about 10 seconds and about 1000 seconds.

As a result of the plasma process 120, passivation layers 130 are formed on the sidewalls of the trenches 80. In embodiments where oxygen plasma is used to form the passivation layer 130, the passivation layer includes $SiO_2$, $MoO_3$, or mixtures thereof. In embodiments where nitrogen plasma is used to form the passivation layer 130, the passivation layer includes SiN, MoN, or mixtures thereof. The passivation layers 130 are formed to have a thickness 135. In some embodiments, the thickness 135 is in a range from about 1 nanometer (nm) to about 15 nm.

The passivation layers 130 help protect the EUV mask 18 in subsequent lithography processes in which the EUV mask 18 may be used. For example, a scanner (e.g., used in a step-and-scan process) may have hydrogen. If the portions of the EUV mask 18 (e.g., the absorber layer 40A or the ML structure 34) defining the sidewalls of the trenches 80 are directly exposed to the hydrogen of the scanner, it may cause erosion or damage to the EUV mask or otherwise affect its performance. Here, the presence of the passivation layers 130 protects the EUV mask 18 from coming into direct contact with the hydrogen (or other contaminant particles) in lithography processes. Consequently, the EUV mask 18 may have a longer lifespan and/or improved performance.

Figure 9:
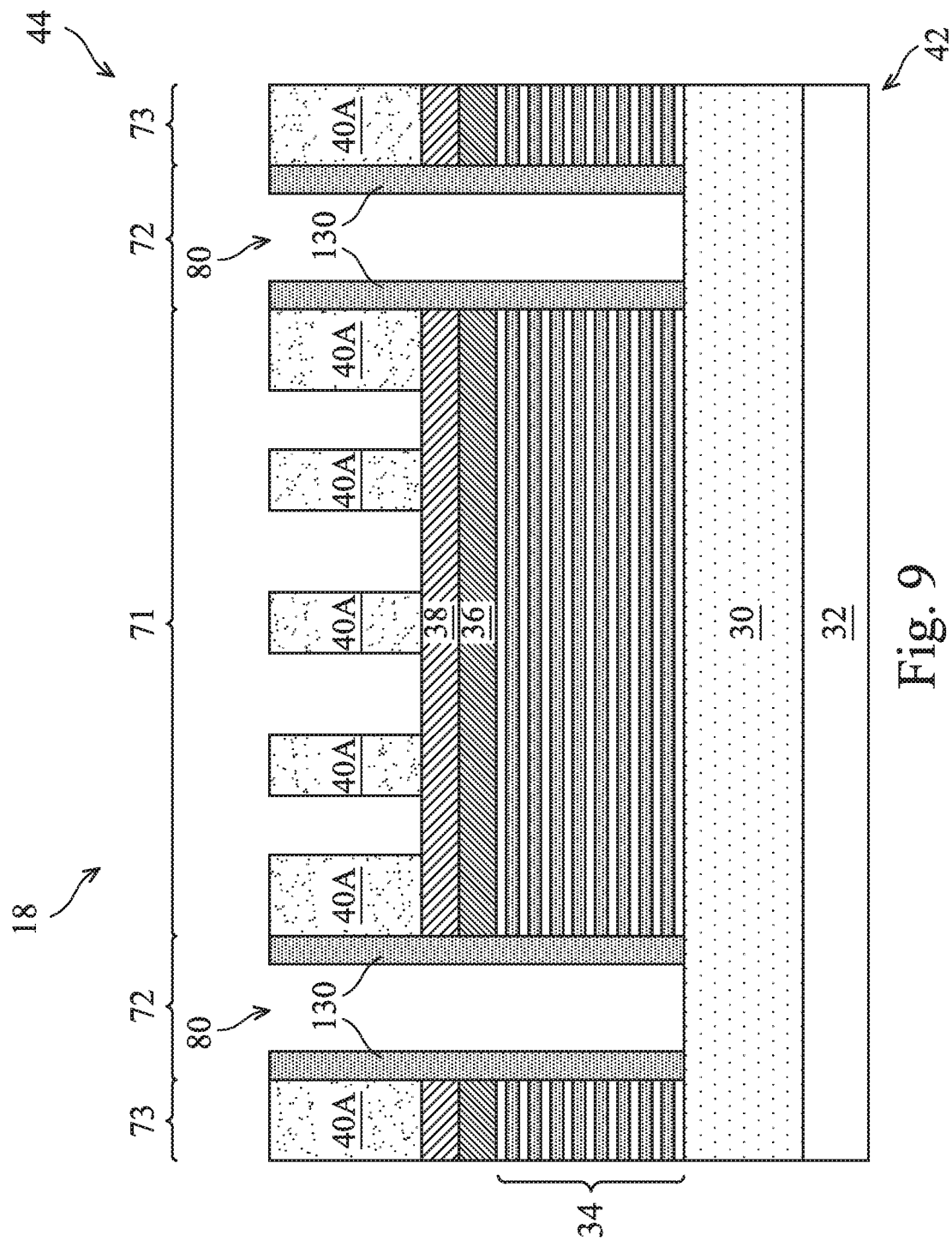
Figure 10:
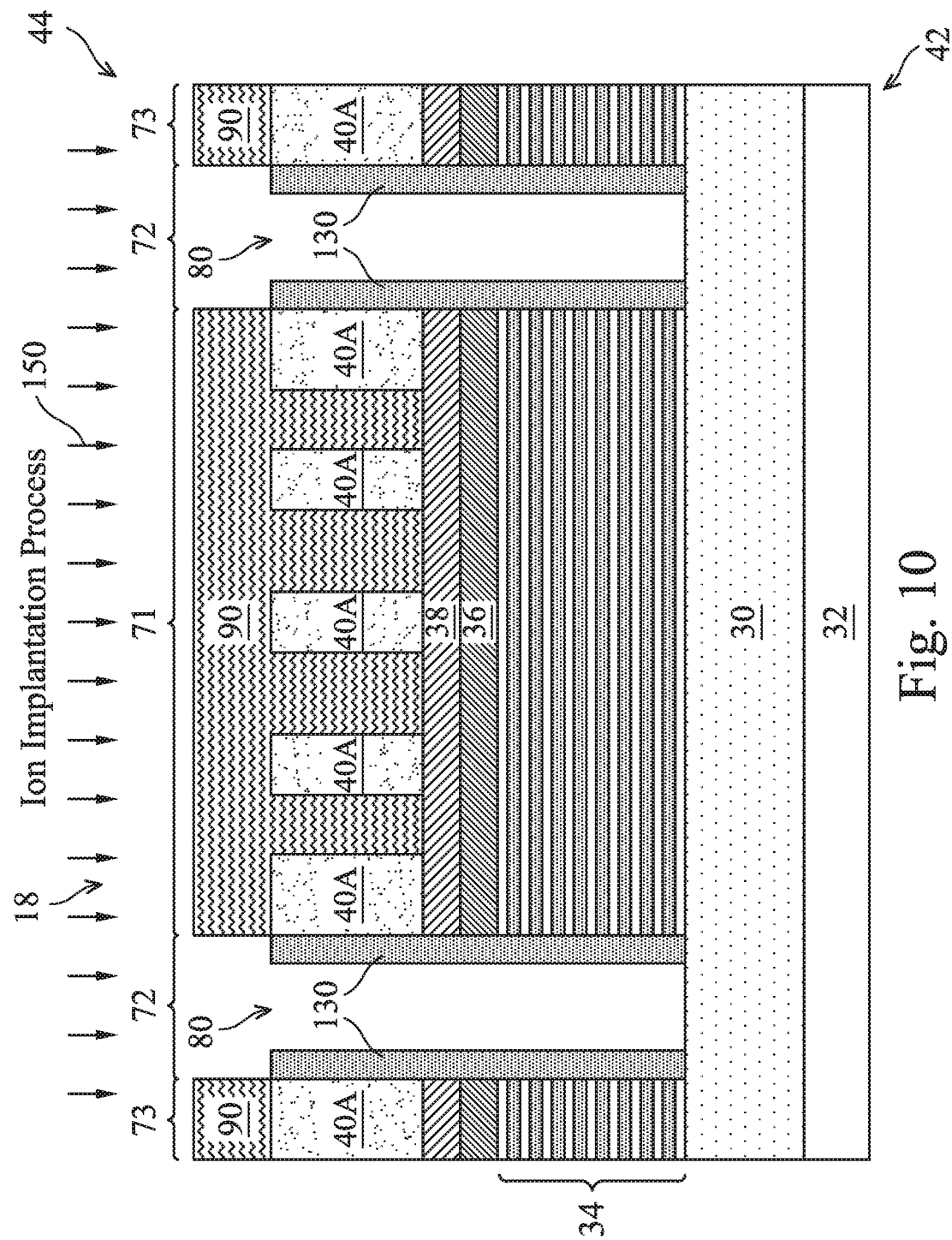

Referring now to FIG. 9, the patterned photoresist layer 90 is removed, for example by a photoresist stripping or ashing process. The EUV mask 18 now has a region 72 (i.e., the "black border" region) that includes the trenches 80, where the side surfaces of the trenches 80 has the passivation layer 130 formed thereon. The LTEM substrate 30 is substantially non-reflective with respect to EUV light, and the openness (e.g., vacuum) of the trenches 80 means that the portions of the LTEM substrate 30 exposed by the trenches 80 will not reflect EUV light. As such, the trenches 80 are considered "dark" with respect to EUV.

It is understood that using the plasma process 120 shown in FIG. 8 to form the passivation layers 130 is merely an example embodiment of the present disclosure. Other techniques may also be used to form the passivation layers 130. For example, referring now to FIG. 10, an ion implantation process 150 may also be used to form the passivation layers 130 on the sidewalls of the trenches 80. In some embodiments, the ion implantation process 150 implants an element having an atomic number that is less than 15. The ion implantation process 150 may be a single element implantation process in some embodiments, or it may be a multi-element implantation process in other embodiments. In some embodiments, the ion implantation process 150 is performed with an implantation energy in a range between about 10 kilo electron volts (keV) and about 800 keV. In some embodiments, the ion implantation process 150 is performed with a tilt angle between about 10 degrees and about 75 degrees. The ion implantation process 150 may be performed in a separate chamber than the etching process 100. In some embodiments, the passivation layer 130 formed by the ion implantation process 150 may have a thickness in a range between about 1 nm and about 10 nm.

After the formation of the passivation layers 130, the patterned photoresist layer 90 is removed, and the resulting EUV mask 18 corresponding to the embodiment with ion implantation is substantially similar to the embodiment corresponding with plasma processes.

Figure 11:
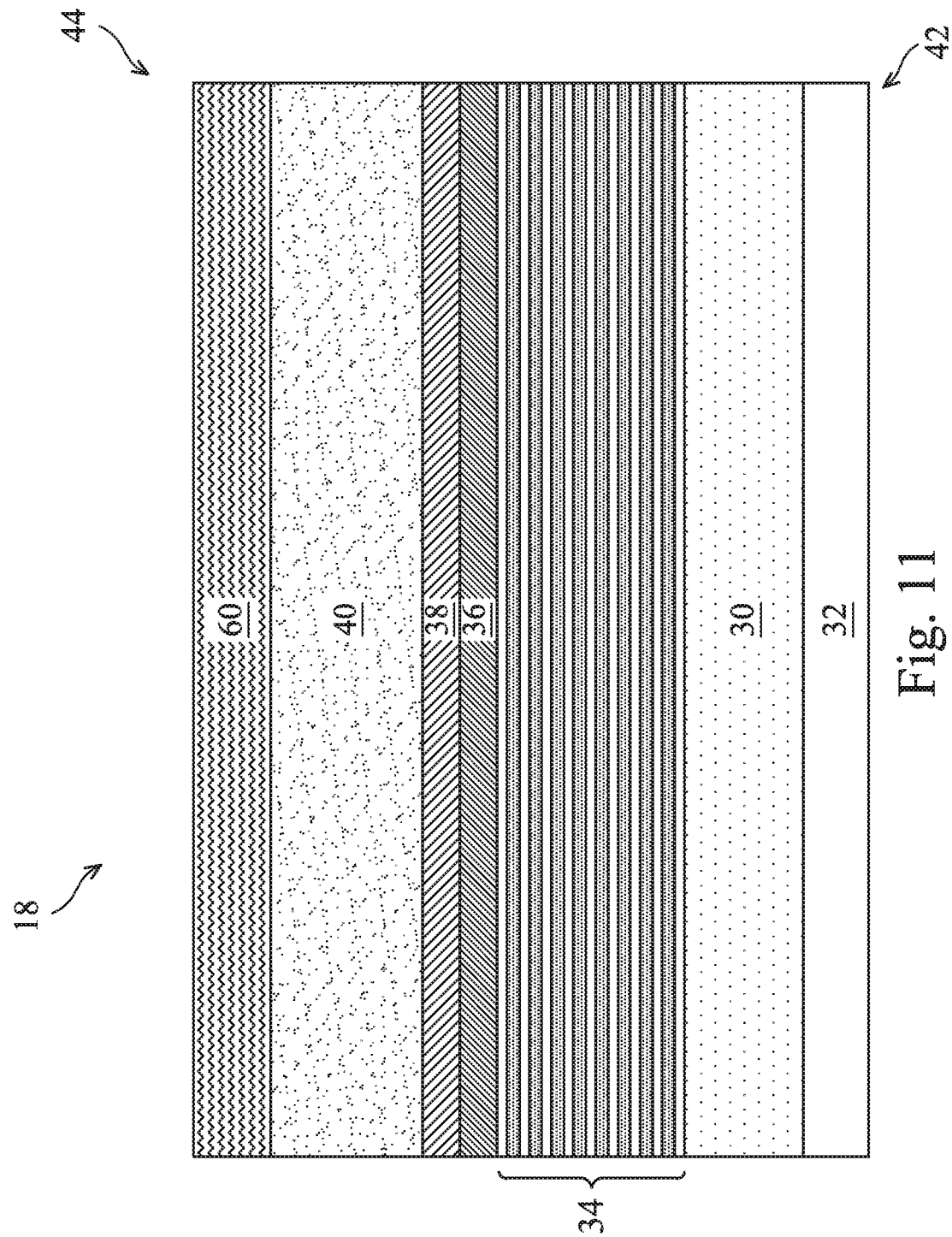

FIGS. 11-17 illustrate another embodiment of fabricating the EUV mask 18 according to various aspects of the present disclosure. For reasons of consistency and clarity, similar components will be labeled the same in FIGS. 11-17 as they are in FIGS. 2-10. Referring to FIG. 11, the conductive layer 32 is formed on the side 42 of the LTEM substrate 30, the ML structure 34 is formed on the side 44 of the LTEM substrate 30. The capping layer 36 is formed on the ML structure 34, the buffer layer 38 is formed on the capping layer 36, the absorber layer 40 is formed on the buffer layer 38. The photoresist layer 60 is formed on the absorber layer 40.

Figure 12:
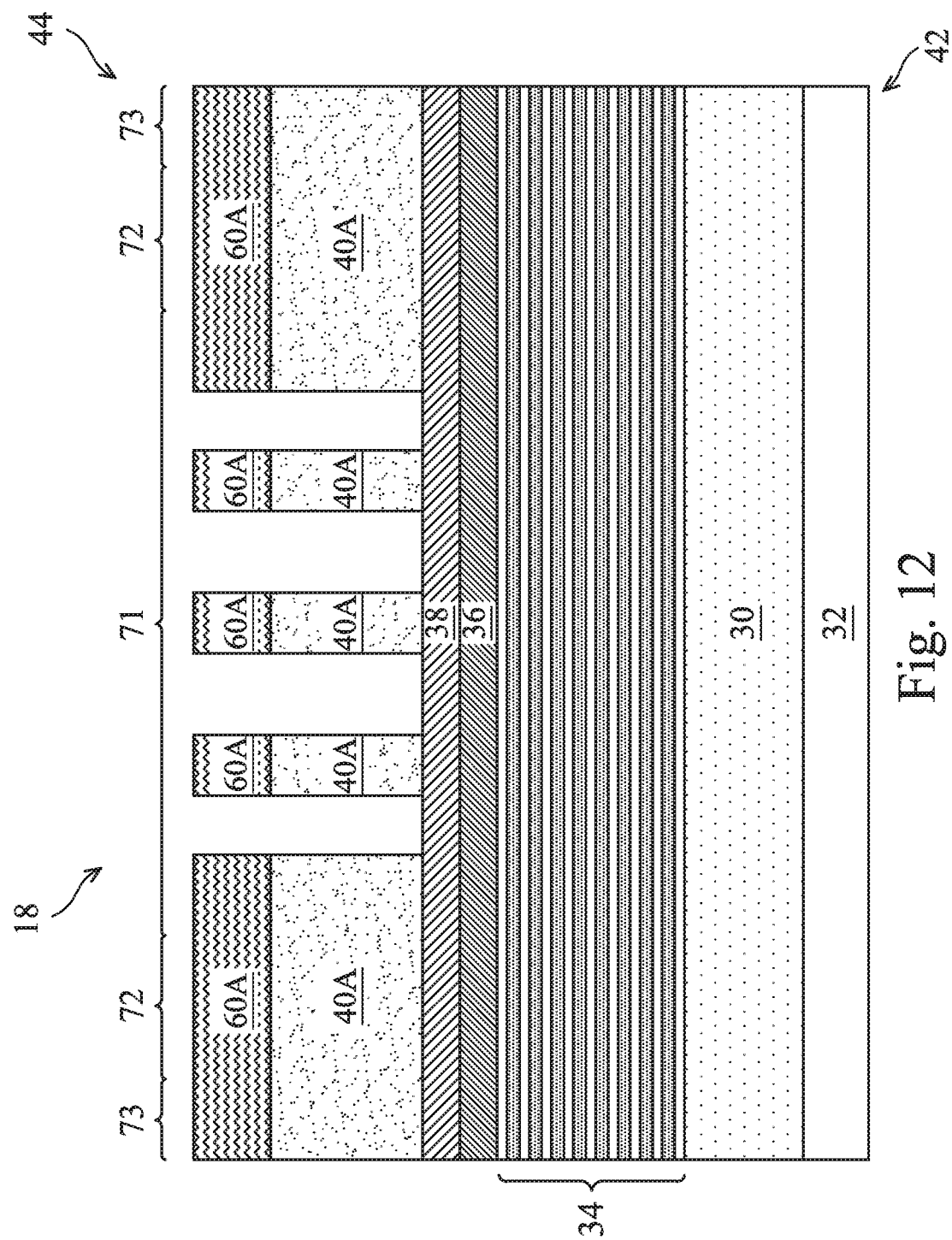

Referring now to FIG. 12, the photoresist layer 60 is patterned into the patterned photoresist layer 60A. The patterned photoresist layer 60A is then used to pattern the absorber layer 40 below, so as to form the patterned absorber layer 40. Unlike the embodiment shown in FIG. 3, the patterning in FIG. 12 has not etched trenches in region 72 of the EUV mask 18 yet. In other words, the absorber patterns are defined in the "main field" region 71 of the EUV mask 18 at the stage of fabrication shown in FIG. 12, but the absorber layer 40 in the regions 72 and 73 of the EUV mask 18 still remain unetched at this point.

Figure 13:
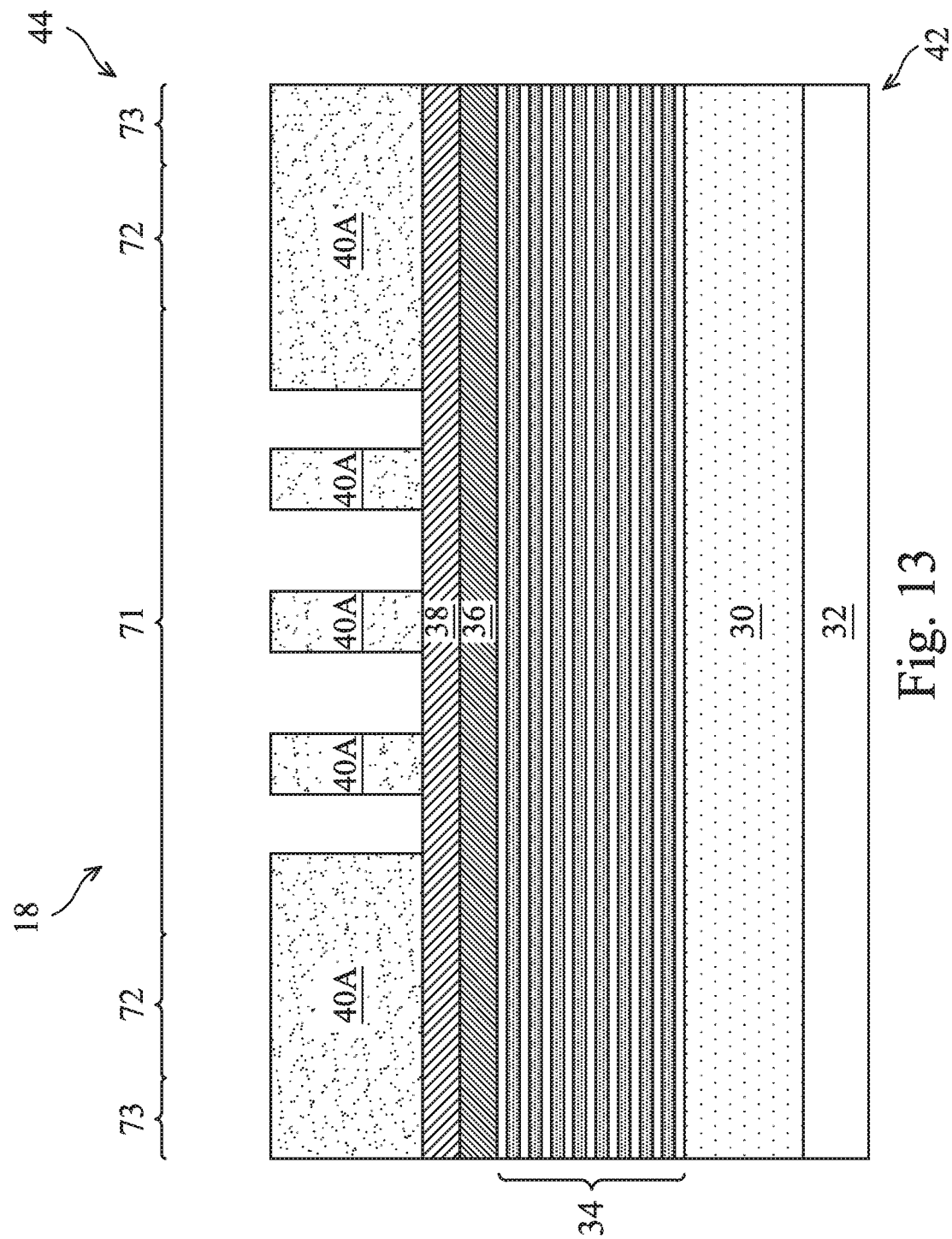

Referring now to FIG. 13, the patterned photoresist layer 60A is removed, for example via a photoresist stripping or ashing process.

Figure 14:
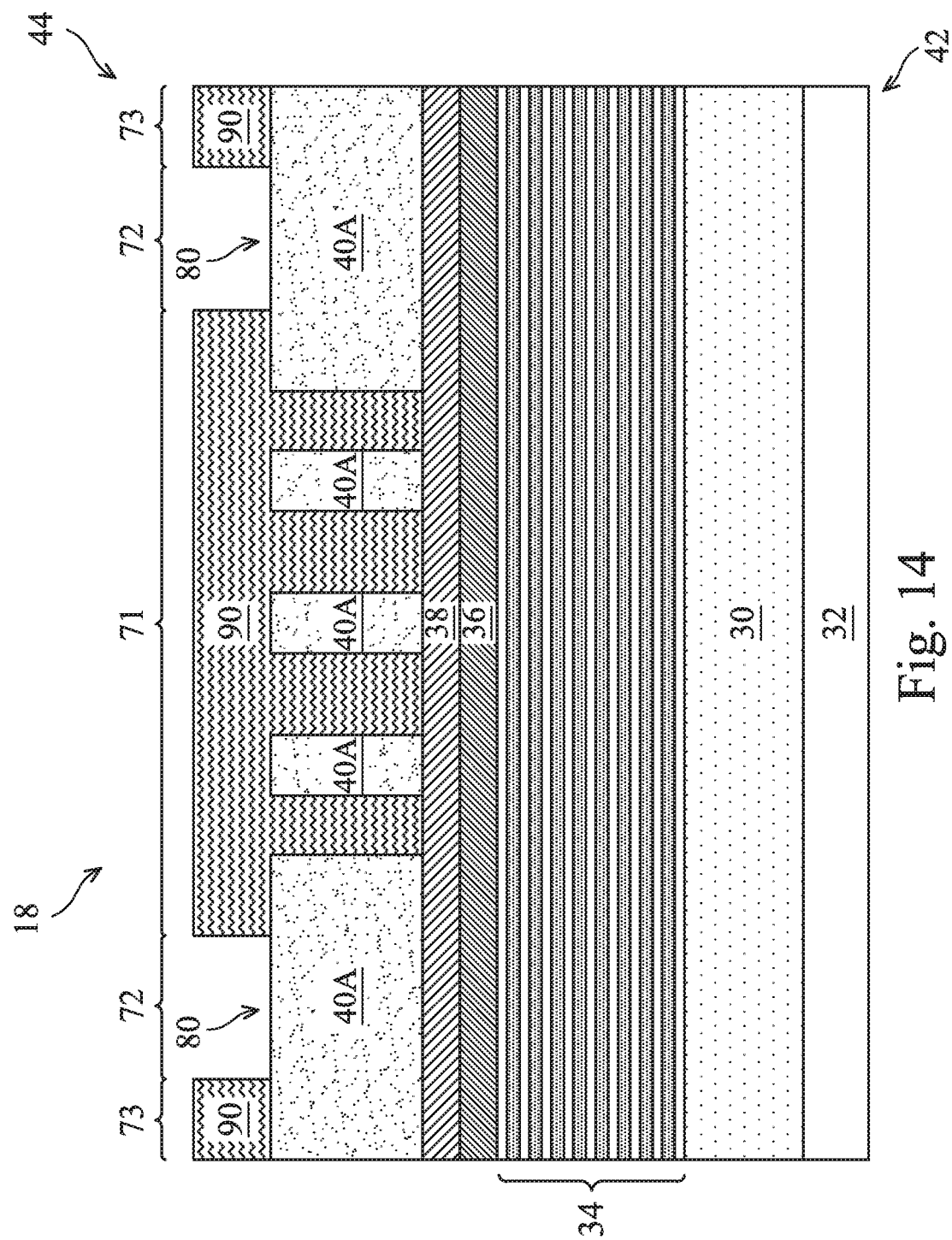

Referring now to FIG. 14, another patterned photoresist layer 90 is formed over the patterned absorber layer 40A. The patterned photoresist layer 90 includes trenches 80 in the region 72 (i.e., the "black border" region) of the EUV mask 18.

Figure 15:
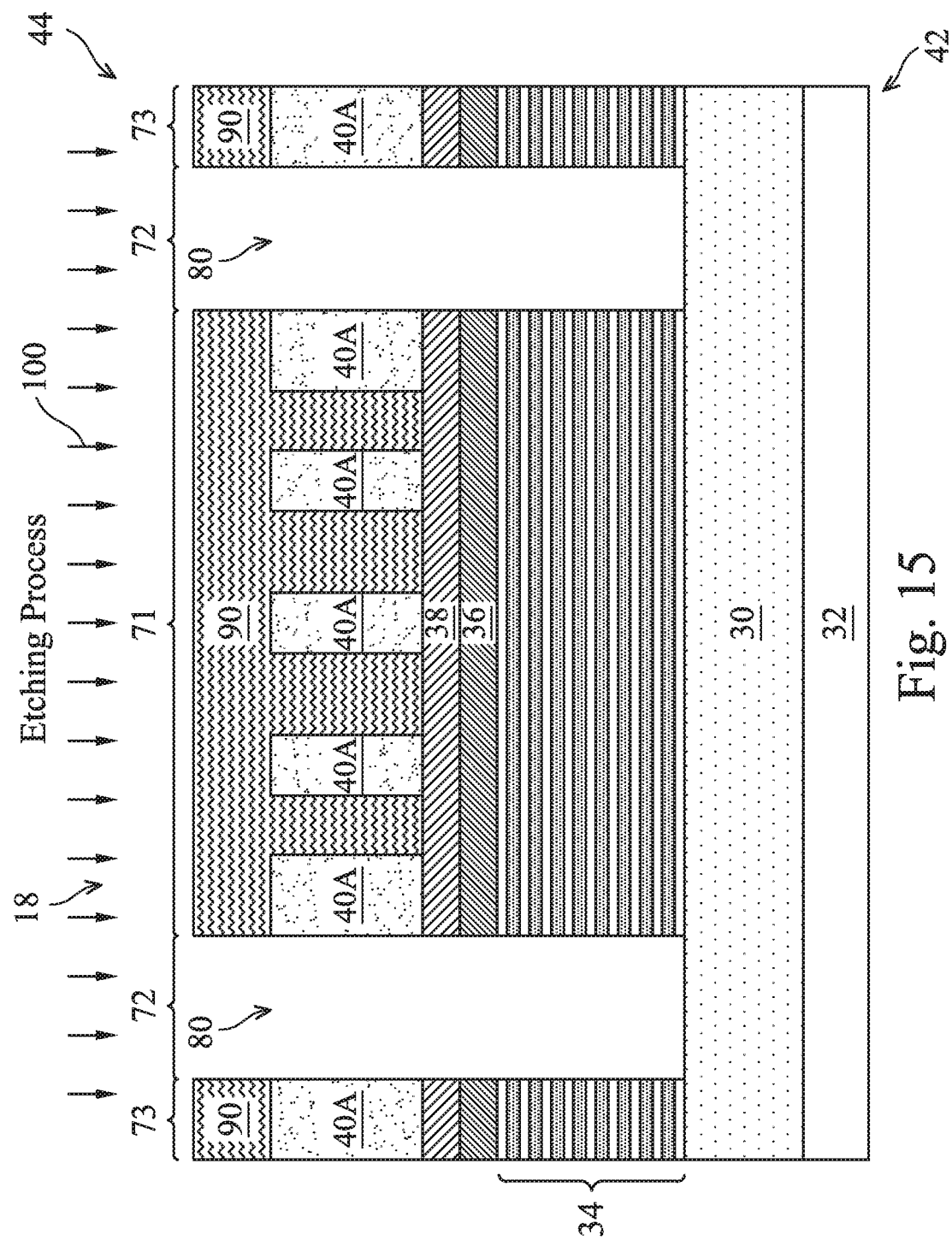

Referring now to FIG. 15, the etching process 100 is performed to extend the trenches 80 downwardly through the layers 36-38 and the ML structure 34, until the upper surface of the LTEM substrate 30 is reached. As discussed above, since the ML structure 34 in the region 72 is etched away, and the trenches 80 (e.g., filled with vacuum) exposes portions of the non-reflective LTEM substrate 30, the region 72 is now substantially non-reflective with respect to EUV light.

Figure 16:
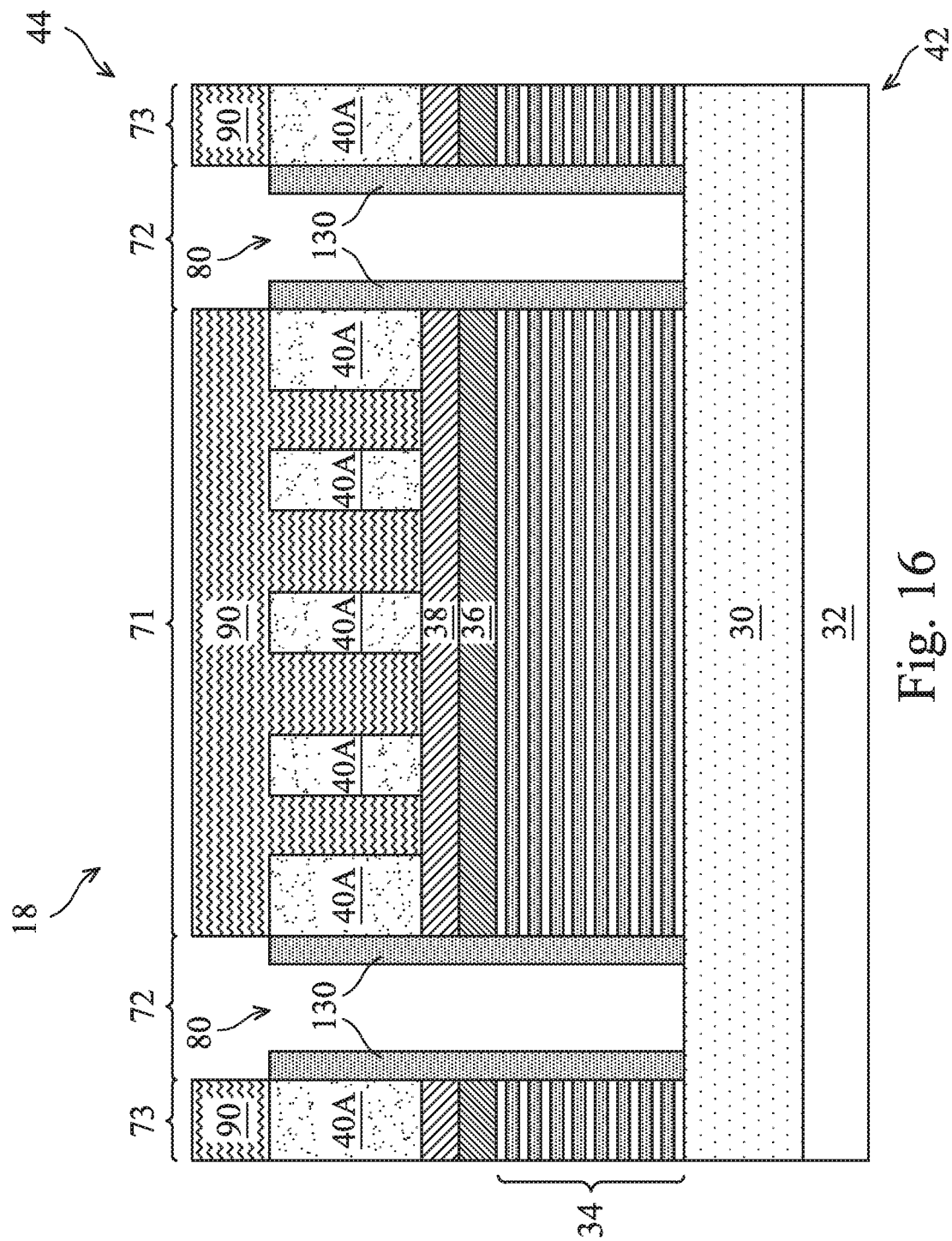

Referring now to FIG. 16, the passivation layers 130 are formed on the sidewalls of the trenches 80. In some embodiments, the passivation layers 130 may be formed by the plasma process 120 discussed above in association with FIG. 8. In some other embodiments, the passivation layers 130 may be formed by the ion implantation process 150 discussed above in association with FIG. 10. As discussed above, the passivation layers 130 protect the EUV mask 18 from unintended exposure to contaminant particles, etc., and as such may improve the longevity and/or performance of the EUV mask 18.

Figure 17:
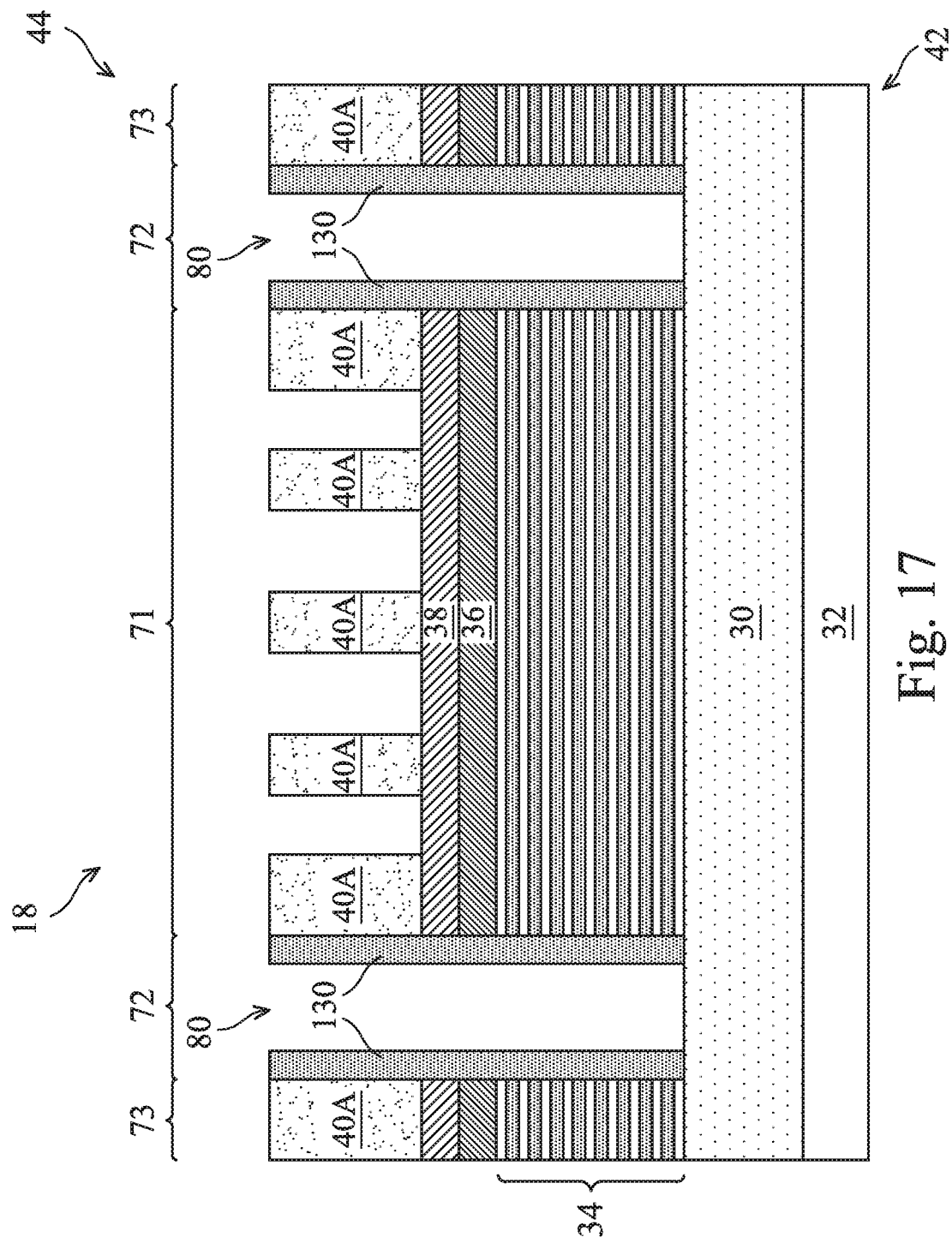
Figure 18:
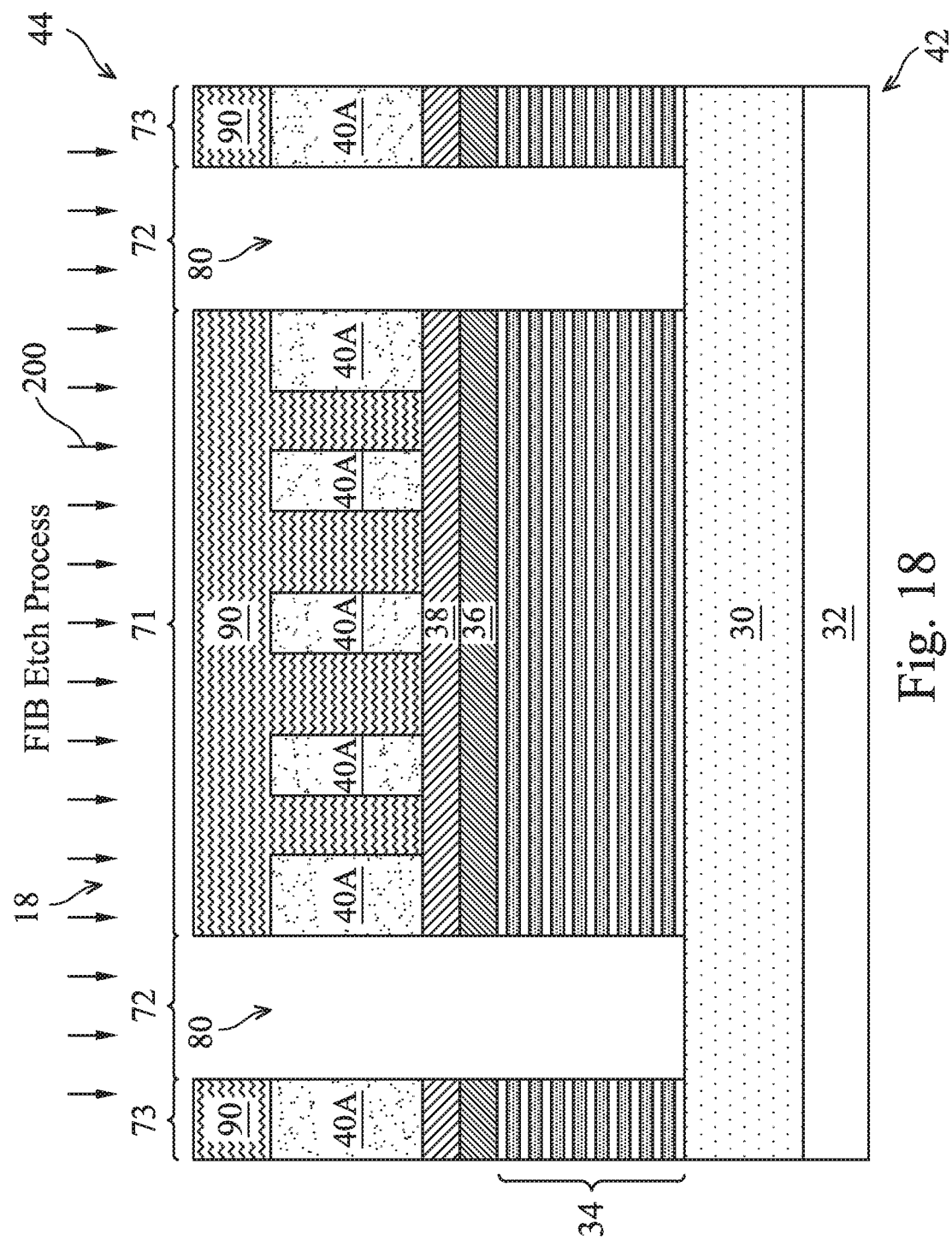

Referring now to FIG. 17, the patterned photoresist layer 90 is removed. Again, the resulting EUV mask 18 may be said to have a "black border" region 72 that is substantially non-reflective with respect to light in the EUV spectrum.

It is also understood that the passivation layers 130 formed by the plasma process 120 or by the ion implantation process 150 discussed above are not the only suitable structures for protecting the sidewalls of the trenches 80. For example, referring now to FIG. 18, instead of performing the etching process 100 in FIG. 7 or 15, a focused ion beam (FIB) etch process 200 may be performed instead to etch the trenches 80 in the EUV mask 18. The FIB etch process 200 uses accelerated ion beams to dig the trenches 80 into the layers 36-38 and the ML structure 34. In some embodiments, the ion source may be gallium. In other embodiments, the ion source may be argon. In some embodiments, the FIB etch process 200 is performed such that the ion beam energy is in a range between about 5 keV and about 30 keV, and/or with a beam current in a range between about 0.2 nA and about 20000 nA.

The application of the accelerated Ar beams or Ga beams also treats the side surfaces of the trenches 80, for example by modifying the micro-structure characteristics and materials compositions of the side surfaces of the layers 36-38 and the ML structure 34. As a result, the modified side surfaces of the layers 36-38 and the ML structure 34 may sufficiently serve as a protective layer—similar to the passivation layers 130—to help prevent or minimize the undesirable exposure of the layers 36-38 and the ML structure 34 to contaminant particles. For example, the side surfaces of the layers 36-38 may include implanted Ar or Ga. Thus, the formation of the passivation layers 130 may not be necessary in the embodiment shown in FIG. 18. It is understood that the fabrication steps preceding the FIB etch process 200 may be the same as the processes discussed above with reference to FIGS. 2-6 or FIGS. 11-14.

In the embodiments discussed above, the portions of the LTEM substrate 30 exposed by the trenches 80 (e.g., vacuum) may be considered the substantially non-reflective material in the "black border" region 72 of the EUV mask 18. However, other non-reflective materials may also be formed in the "black border" region 72 of the EUV mask 18 in other embodiments, as discussed below with reference to FIGS. 19-26. Again, for reasons of consistency and clarity, similar components will be labeled the same throughout all figures.

Figure 19:
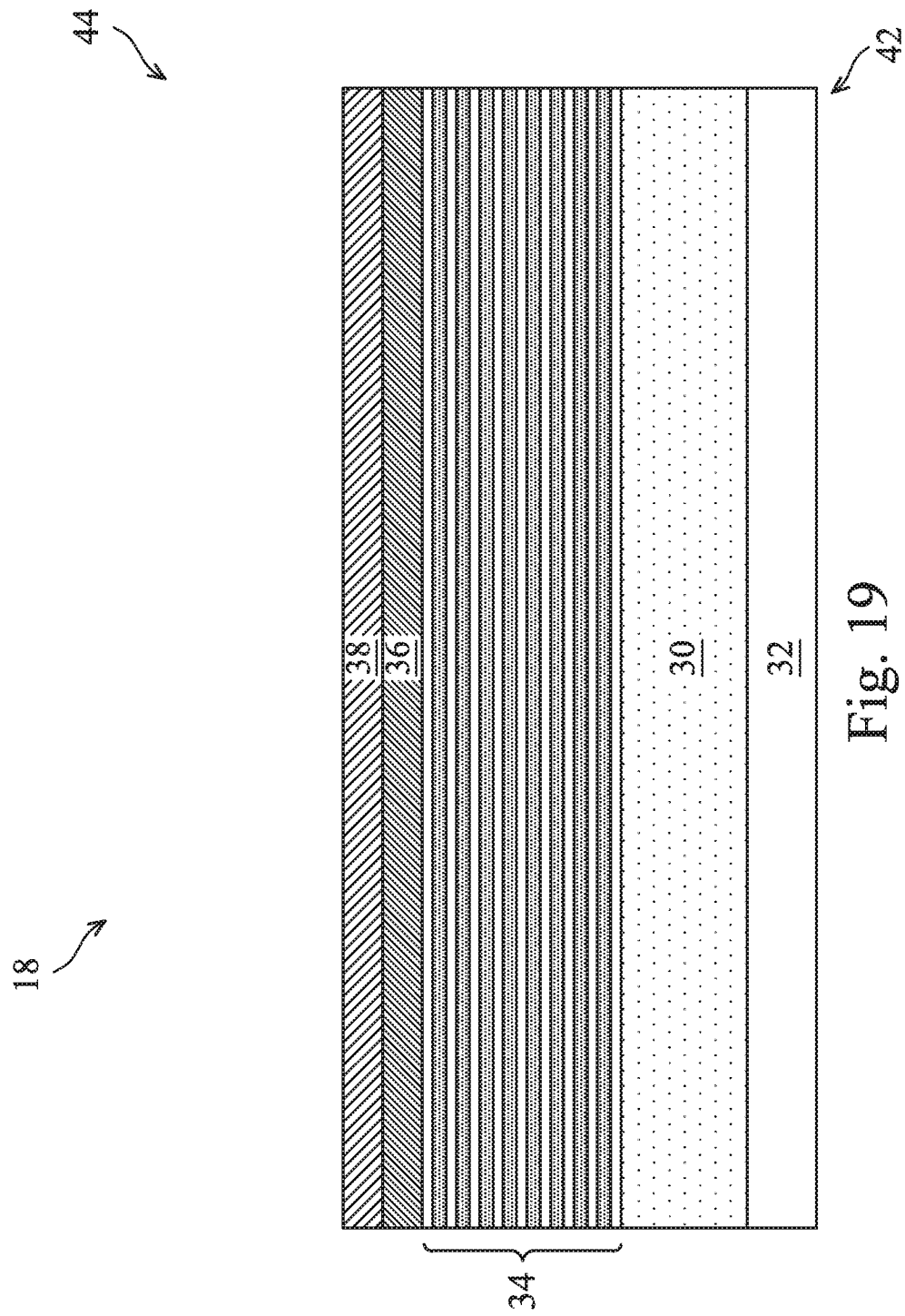

Referring now to FIG. 19, a "blank" EUV mask 18 is provided. The EUV mask 18 at this stage of fabrication includes the LTEM substrate 30, the conductive layer 32 formed on the side 42 of the LTEM substrate 30, the ML structure 34 formed on the side 44 of the LTEM substrate, the capping layer 36 formed on the ML structure, and the buffer layer 38 formed on the capping layer 36. No absorber layer has been formed at this stage of fabrication yet.

Figure 20:
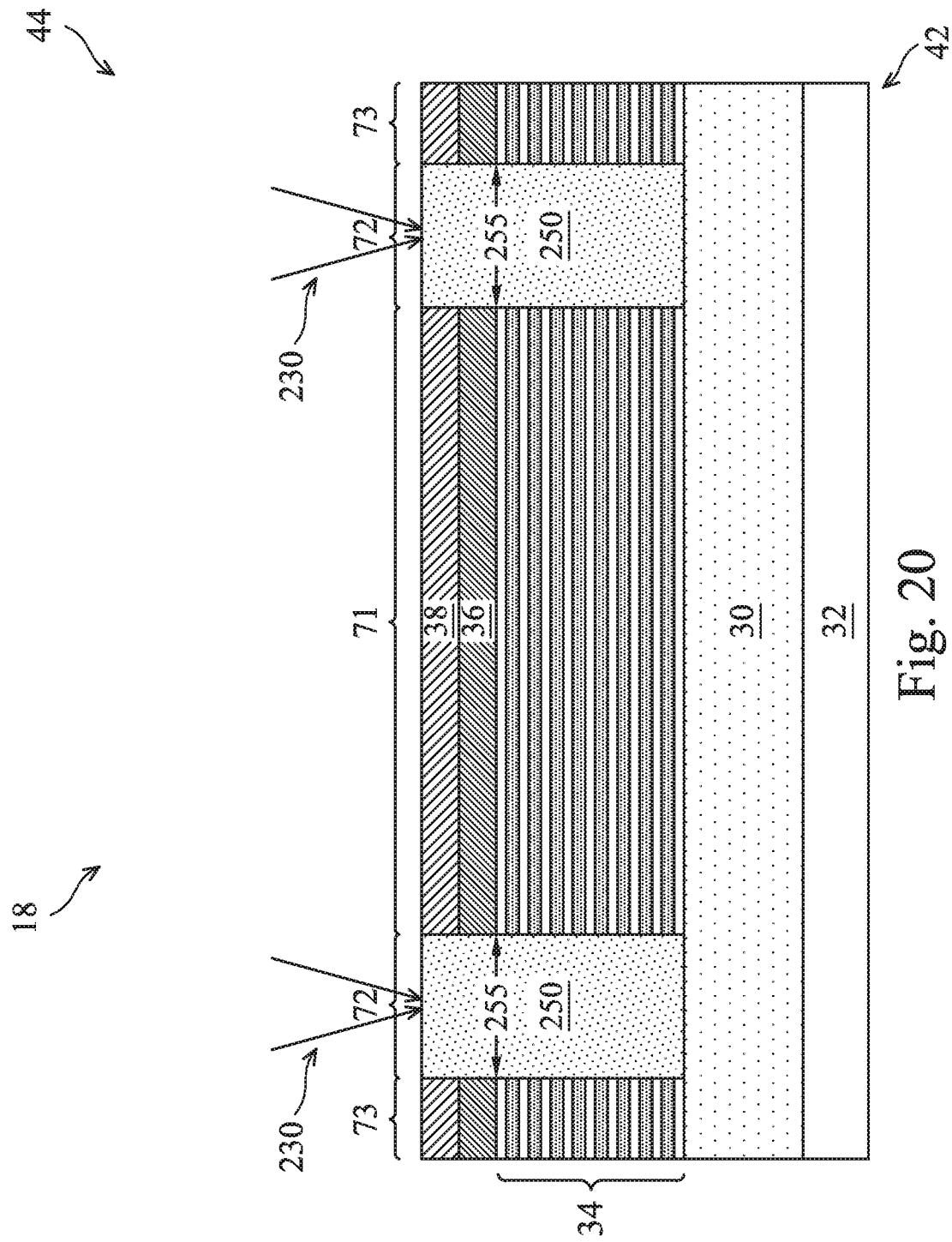

Referring now to FIG. 20, a laser process is performed to the EUV mask 18 from the side 44. In more detail, laser beams 230 are projected unto the region 72 of the EUV mask 18, but not the other regions 71 and 73. In some embodiments, the laser process is performed with a laser wavelength in a range between about 193 nm and about 1500 nm, with a laser power in a range between about 1 watt and about 100 watts, and with a laser pulse duration of about 100 fs-CW (where fs stands for femtoseconds, and CW stands for continuous wave).

As a result of the application of the laser beams 230, non-reflective elements 250 are formed in the region 72 of the EUV mask 18. For example, the application of the laser beams 230 produces heat. The heat produced may cause inter-diffusion between the film pairs (e.g., silicon and molybdenum film pairs) in the ML structure 34 located in the region 72. The inter-diffusion within the ML structure 34 disrupts the reflective properties of the ML structure 34 located in the region 72. As such, the inter-diffused portions of the ML structure 34 become the non-reflective elements 250. In some embodiments, the non-reflective elements 250 are formed as an alloy of Mo and Si.

In some embodiments, a lateral dimension 255 of the non-reflective elements 250 may be configured by adjusting the parameters of the laser beams 230, for example by adjusting the intensity and/or area coverage of the laser beams 230. In some embodiments, the lateral dimension 255 is in a range between about 200 nm and about 350 nm. It is also understood that the non-reflective elements 250 may extend through the layers 36-38 in some embodiments, or it may not extend through the layers 36-38 in other embodiments.

Figure 21:
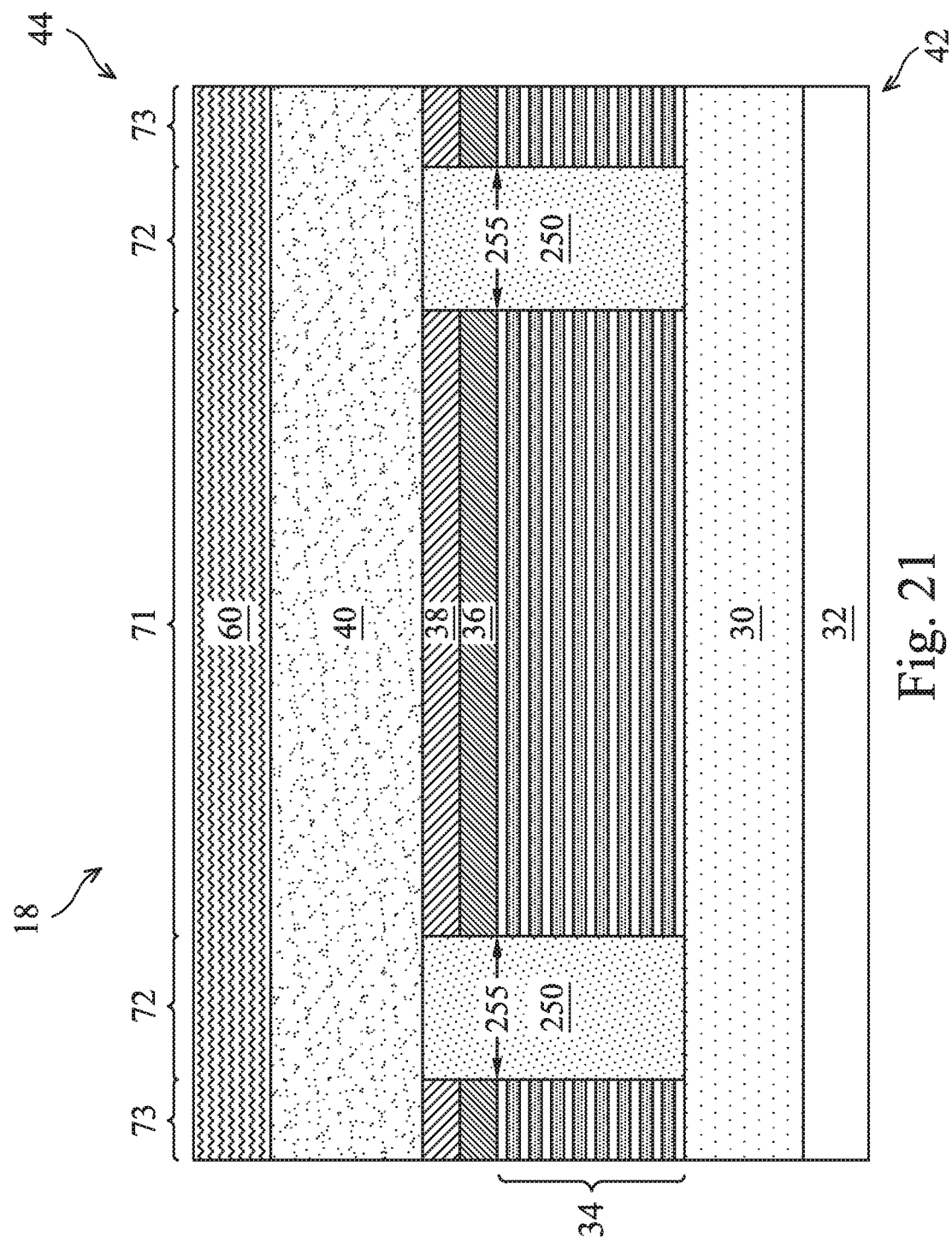

Referring now to FIG. 21, the absorber layer 40 is formed on the layer 38, and the photoresist layer 60 is formed on the absorber layer 40.

Figure 22:
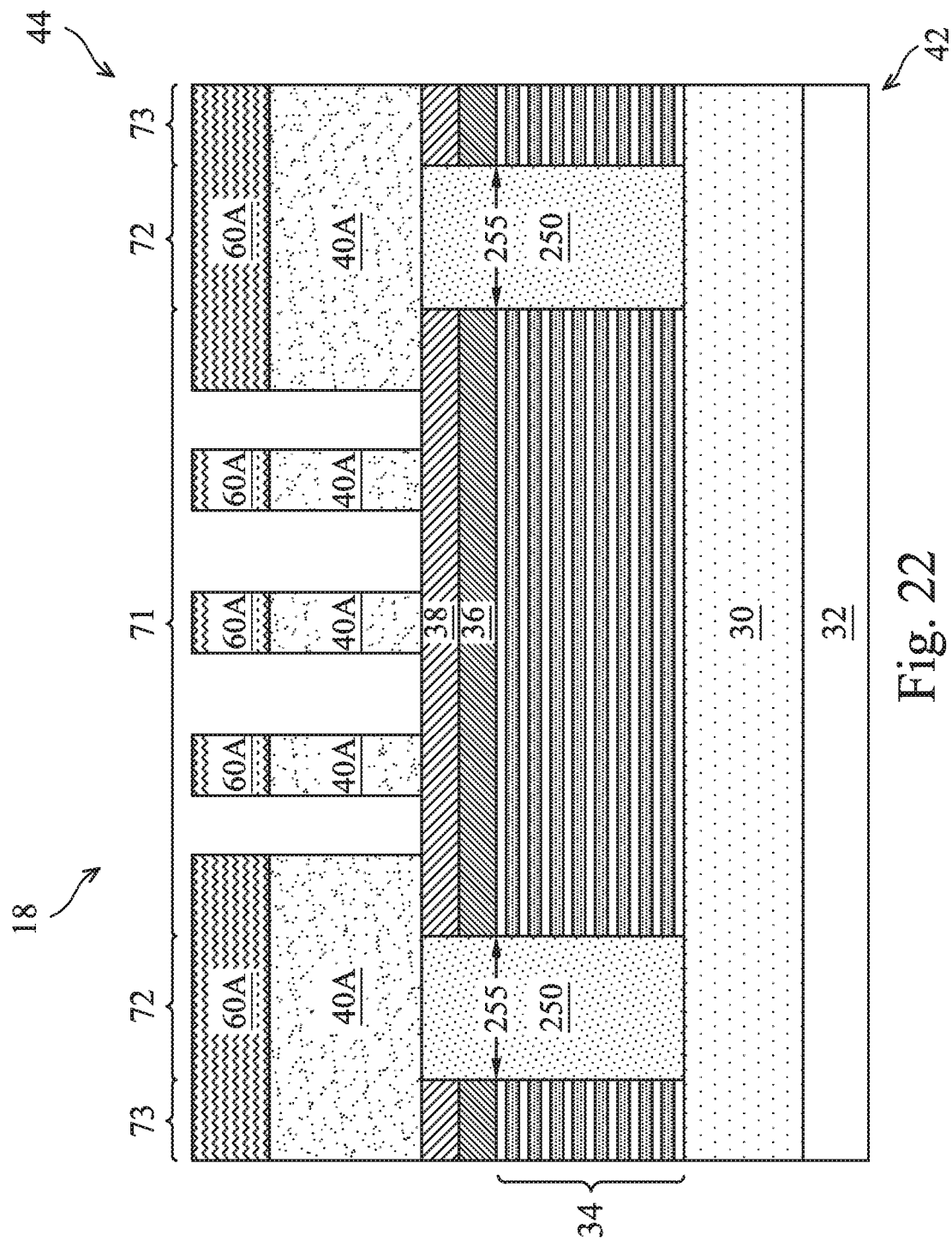

Referring now to FIG. 22, the photoresist layer 60 is patterned into the patterned photoresist layer 60A. The patterned photoresist layer 60A is then used to pattern the absorber layer 40 below, so as to form the patterned absorber layer 40A.

Figure 23:
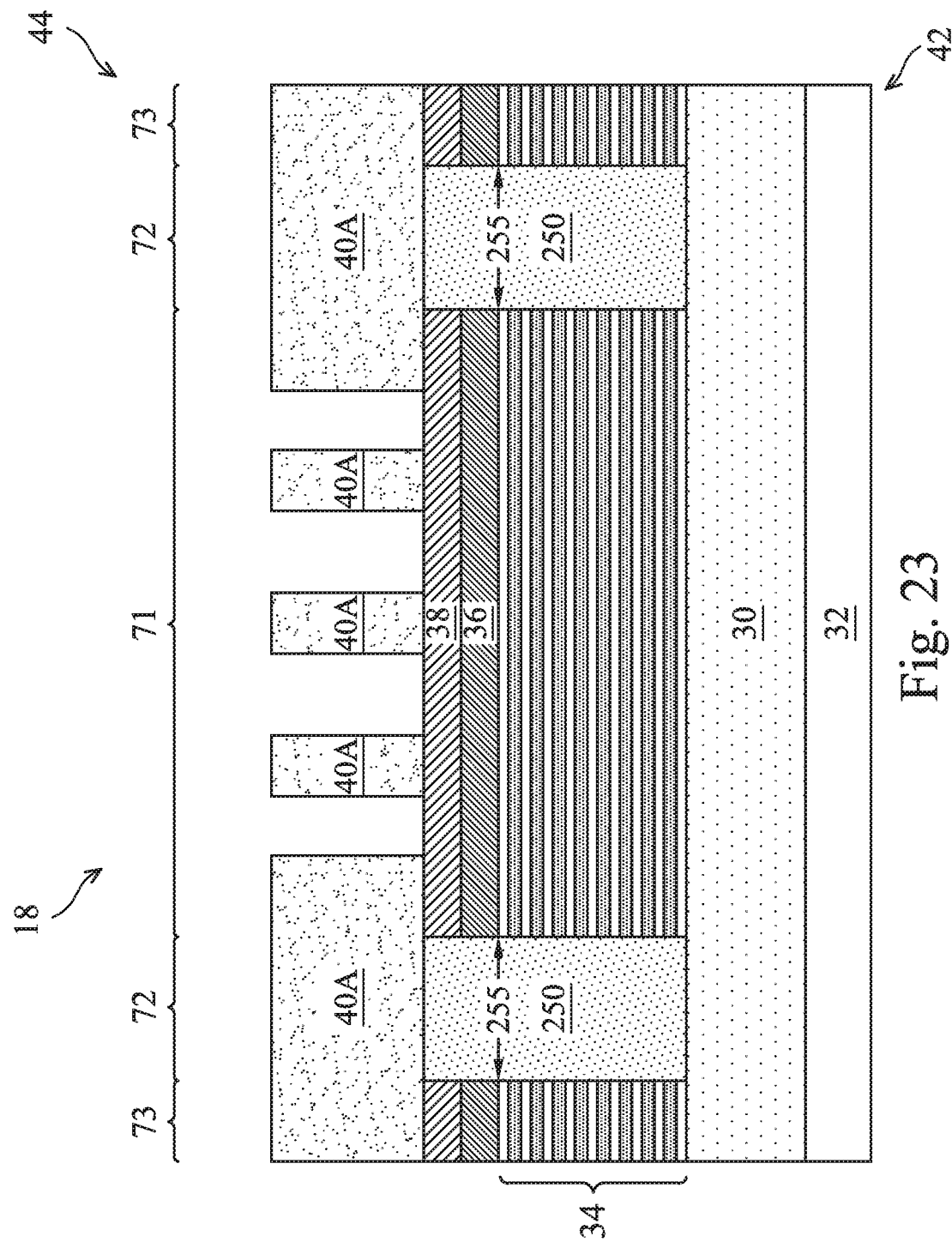
Figure 24:
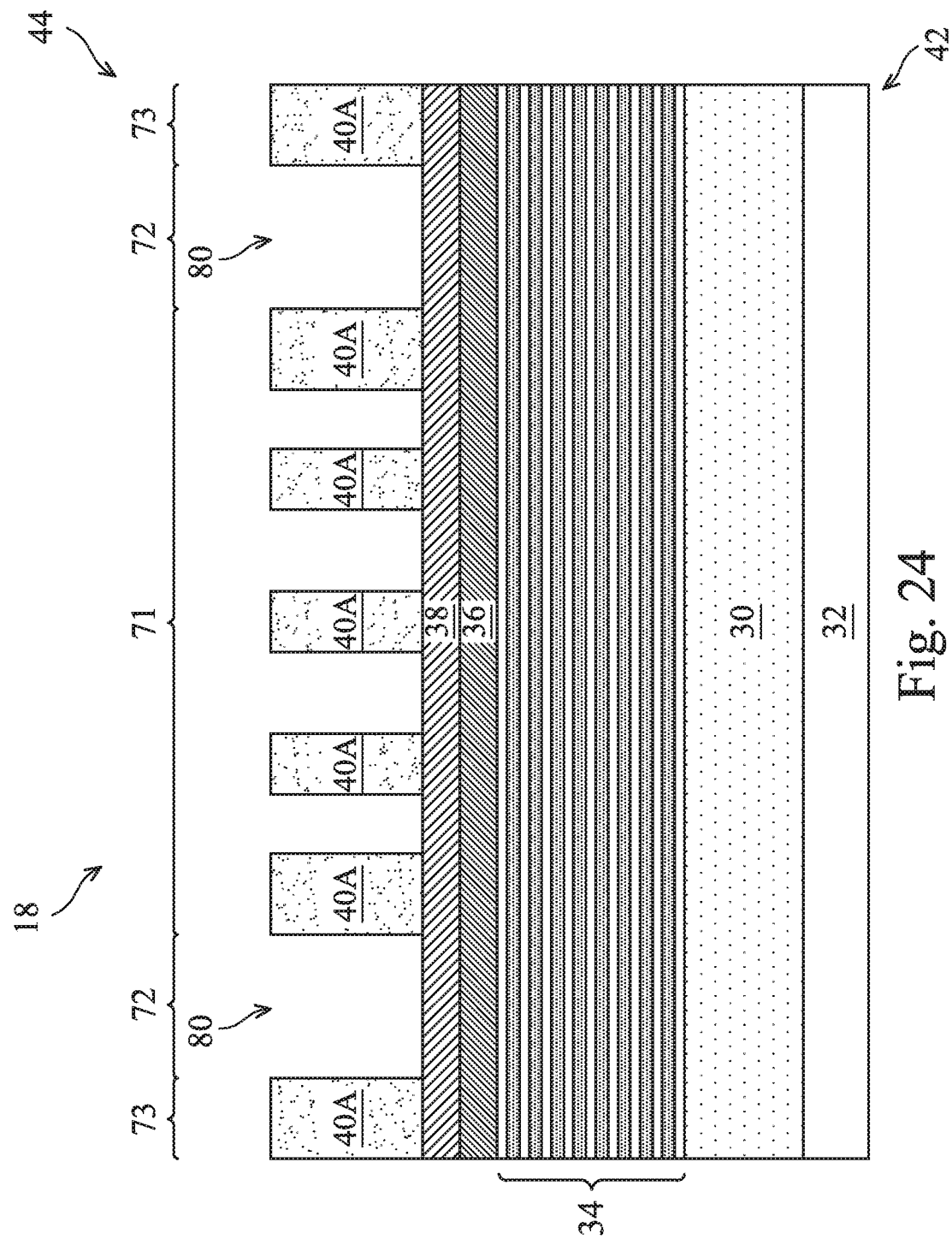

Referring now to FIG. 23, the patterned photoresist layer 60A is removed, for example via a photoresist stripping or ashing process.

Compared with the embodiments discussed above with reference to FIGS. 2-18, where trenches 80 exposing the LTEM substrate 30 as the non-reflective elements, the embodiment corresponding to FIGS. 19-23 embeds elements 250 in the region 72 of the EUV mask 18 as the non-reflective material. The elements 250 are substantially non-reflective with respect to light in the EUV spectrum, since the inter-diffusion between the film pairs in the ML structure 34 disrupts the reflective properties of the portion of the ML structure in the "black border" region 72.

In the embodiment discussed above with reference to FIGS. 19-23, the laser treatment process is performed (to form the non-reflective elements 250) before the absorber layer 40 is patterned. However, the laser treatment process may also be performed after the patterning of the absorber layer 40 in some embodiments. For example, referring to FIG. 24, which shows that the patterned absorber layer 40A has already been formed, for example by using the patterned photoresist layer 60A to pattern the absorber layer. The photoresist layer is then removed after the patterning of the absorber layer 40A. According to this embodiment, the non-reflective elements 250 have not been formed yet at this stage of fabrication, though the trenches 80 are already formed in the region 72 of the EUV mask 18.

Figure 25:
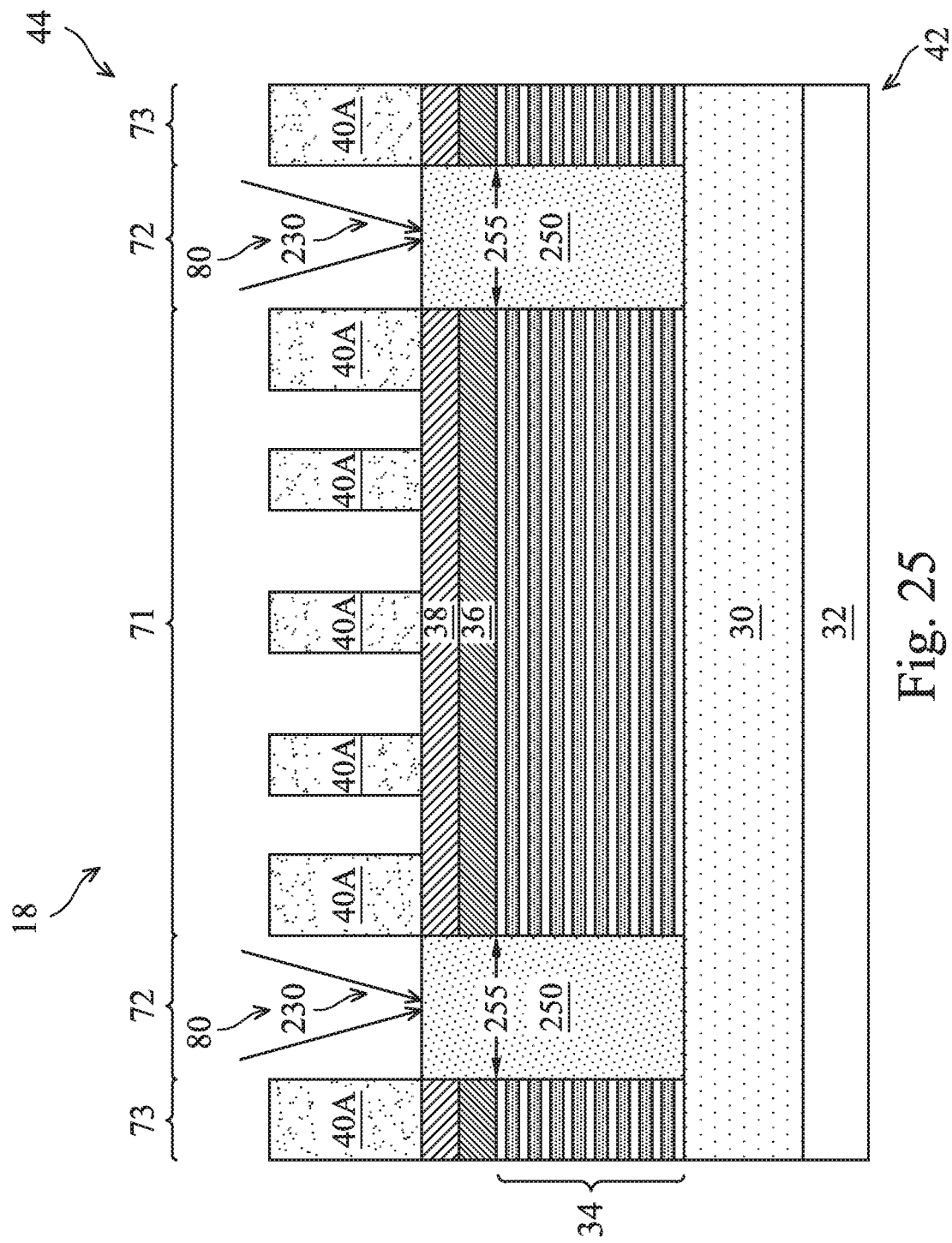

Referring now to FIG. 25, the laser treatment process is performed to form the non-reflective elements 250 embedded in the ML structure 34. As a part of the laser treatment process, the laser beams 230 are projected to the ML structure 34 through the trenches 80. Again, the heat generated by the laser beams 230 may cause inter-diffusion between the reflective film pairs in the ML structure 34, thereby transforming portions of the ML structure 34 into the non-reflective elements 250 in the region 72.

Figure 26:
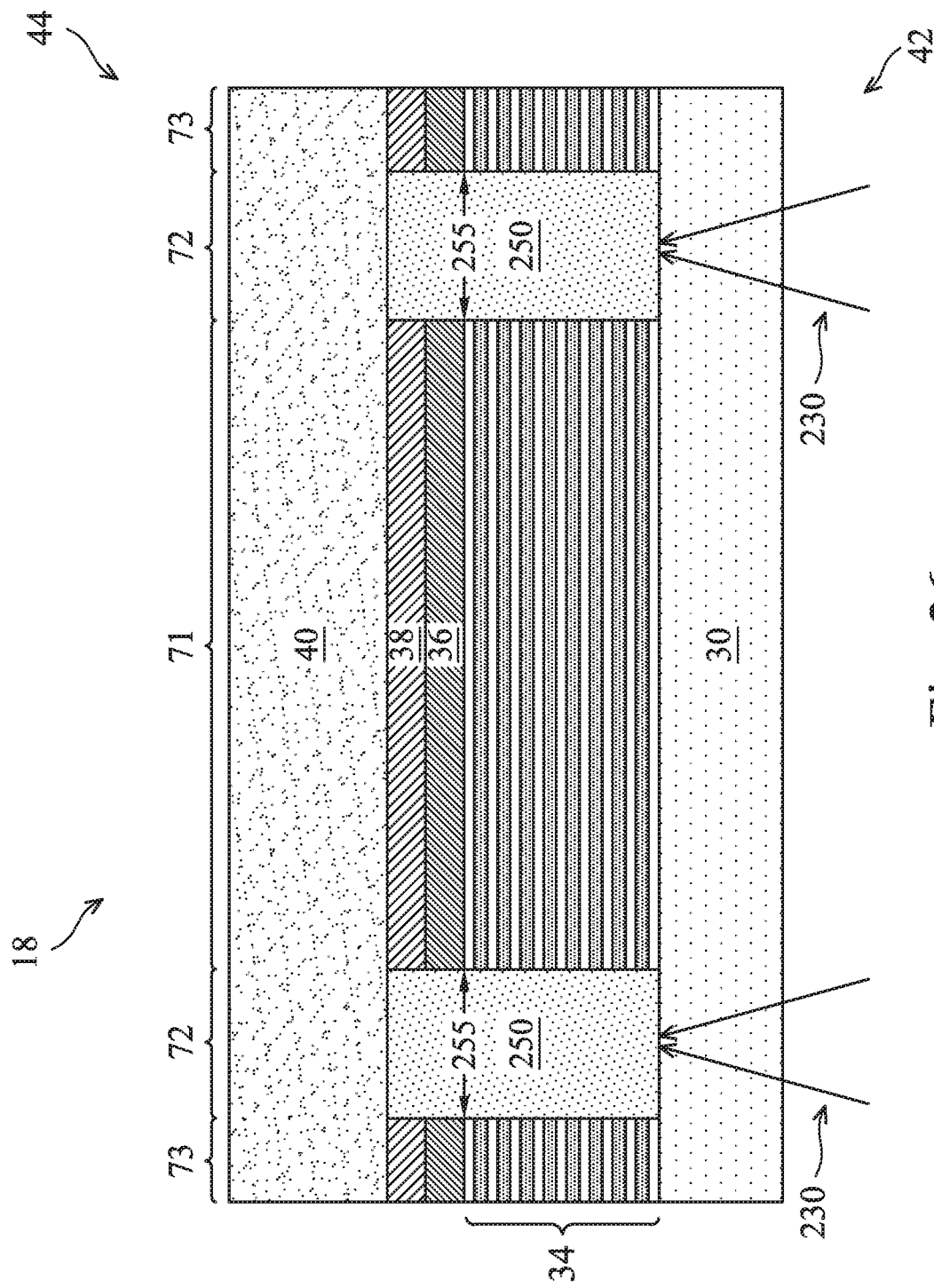

It is also understood that the laser treatment process may also be performed from the side 42 in some embodiments. For example, referring to FIG. 26, the ML structure 34, the capping layer 36, the buffer layer 38, and the absorber layer 40 have all been formed over the side 44 of the LTEM substrate 30, but the conductive layer 32 has not been formed over the side 42 of the LTEM substrate 30 yet. The reason that the conductive layer 32 has not been formed is so that it does not block the laser beams. As shown in FIG. 26, the laser beams 230 may be projected from the side 42 toward the side 44 in the region 72. Without the conductive layer 32 being in the way, the laser beams 230 may penetrate through the LTEM substrate 30 to treat the ML structure 34, for example by causing inter-diffusion within the ML structure 34. Consequently, the non-reflective elements 250 are formed in the ML structure 34 from the side 42. After the formation of the non-reflective elements 250, the fabrication process flow may be similar to the various embodiments discussed above. For example, the absorber layer 40 may be patterned by a patterned photoresist layer, so that the patterned features of the absorber layer in the region 71 may be used to define IC patterns in subsequent processes.

Figure 27:
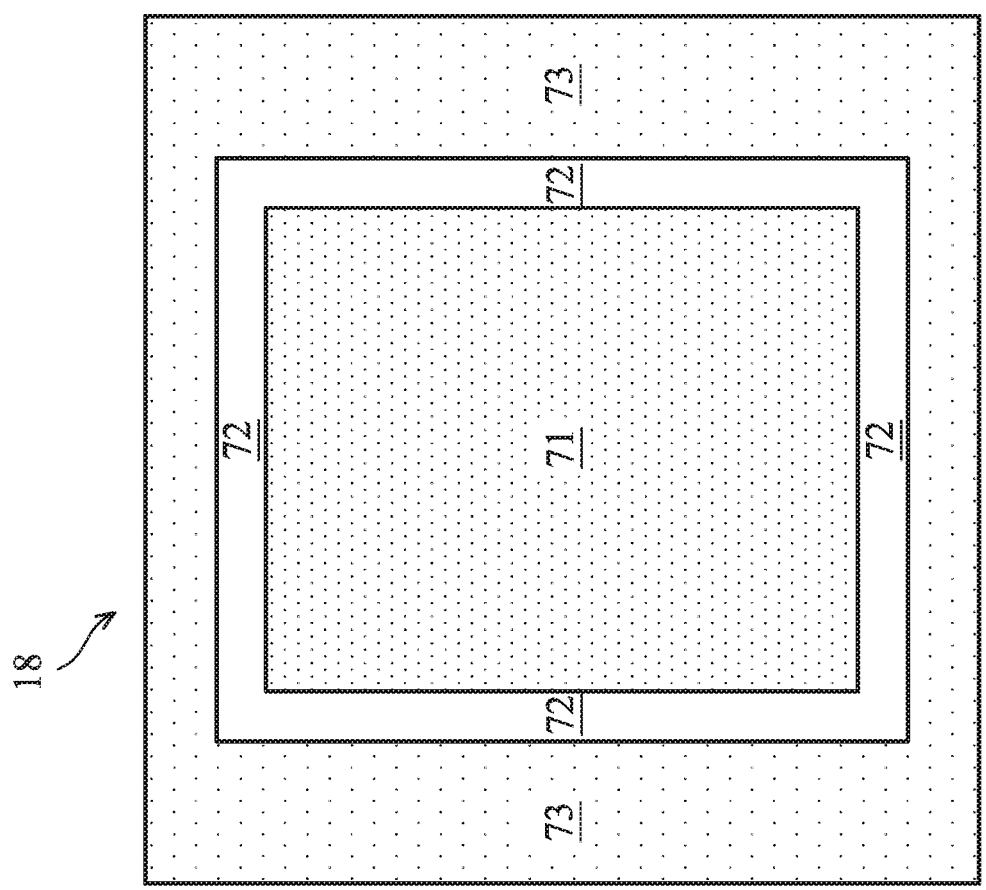
FIGS. 27-29 illustrate top views of a lithography mask according to different embodiments of the present disclosure.

FIG. 27 illustrates a top view of an EUV mask 18 according to an embodiment of the present disclosure. As shown in FIG. 27, the "main field" region 71 is located at a center of the EUV mask 18 may occupy a significant amount of real estate of the EUV mask. As discussed above, the patterned absorber layer features are located in the region 71, and these patterned absorber layer features may be used to define IC elements in a subsequent semiconductor fabrication process using the EUV mask 18.

The region 71 is circumferentially surrounded (e.g., surrounded in 360 degrees) by the region 72, also known as the "black border" region. As discussed above, the present disclosure forms the "black border" region 72 such that it is filled with a non-reflective material with respect to EUV light. As such, the "black border" region 72 reduces or prevents field-to-field interference problems that may plague conventional EUV masks. In the embodiment of FIG. 27, the non-reflective material may include trenches (such as trenches 80 discussed above) that extend through the absorber layer. The trenches may be filled with vacuum and thus exposes the non-reflective LTEM substrate 30, and in some embodiments, passivation layers (e.g., the passivation layers 130 discussed above) may also be formed (e.g., by oxygen/nitrogen plasma or by ion implantation) on the sidewalls of the trenches. The passivation layers help protect the EUV mask from undesirable exposure to contaminant materials.

The region 72 is also circumferentially surrounded by the region 73, which includes the rest of the EUV mask 18. The region 73 may include portions of the absorber layer that have not been specifically patterned, since the region 73 is not used to define the IC features in subsequent fabrication processes. The region 73 may include materials that are somewhat non-reflective, but not as non-reflective as the materials in the "black border" region 72.

Figure 28:
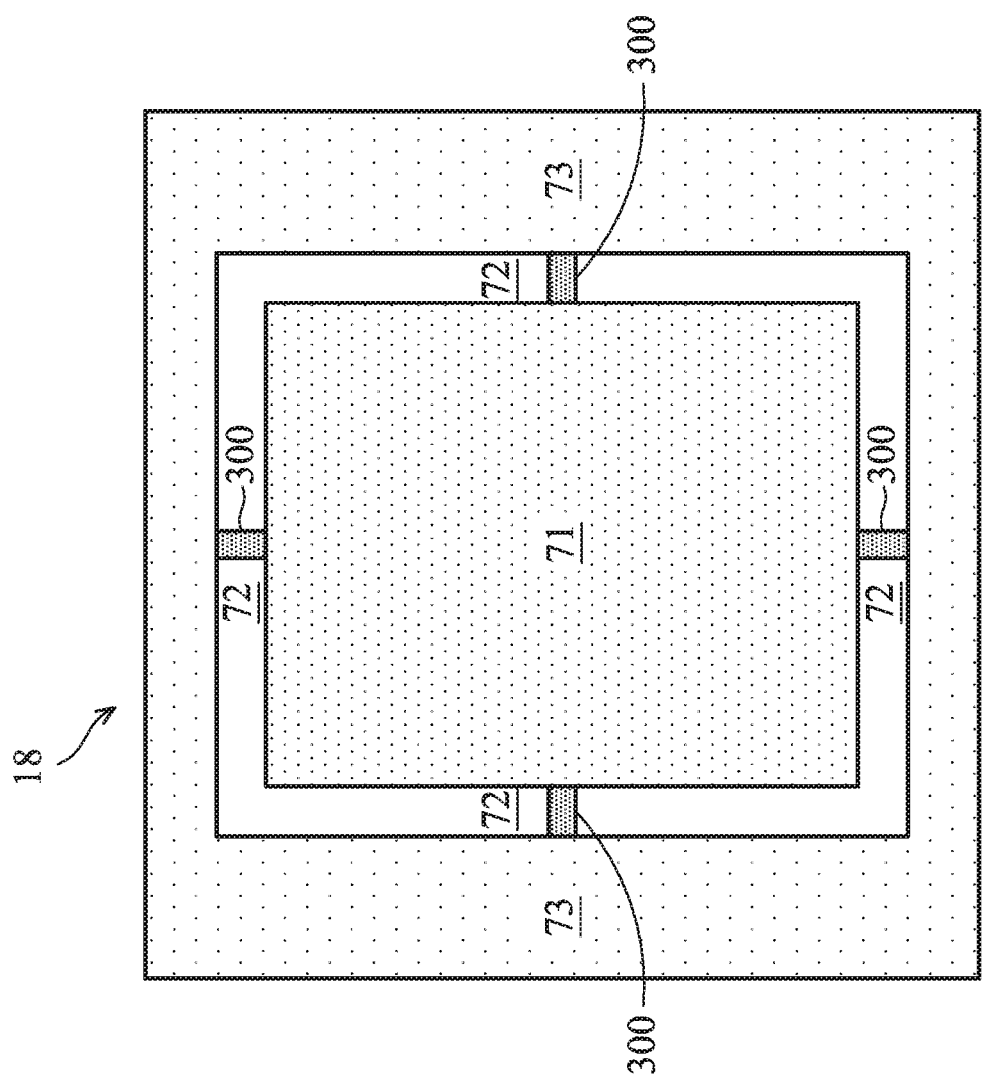

FIG. 28 illustrates a top view of an EUV mask 18 according to another embodiment of the present disclosure. The embodiment of FIG. 28 is similar to the embodiment of FIG. 27, except that the EUV mask 18 further includes one or more bridges 300 that are located in the region 72. For example, four bridges 300 are shown in the embodiment of FIG. 28, where a different bridge is connected to each of the four sides of the region 71. The bridges 300 electrically interconnect the regions 71 and 73 together, so as to prevent or reduce electrical charges from being built up in the region 71. In other words, the bridges 300 may serve as a conduit for diffusing excessive electrical charges. In some embodiments, the bridges 300 are formed by the multilayers of Mo/Si in the ML structure 34.

Figure 29:
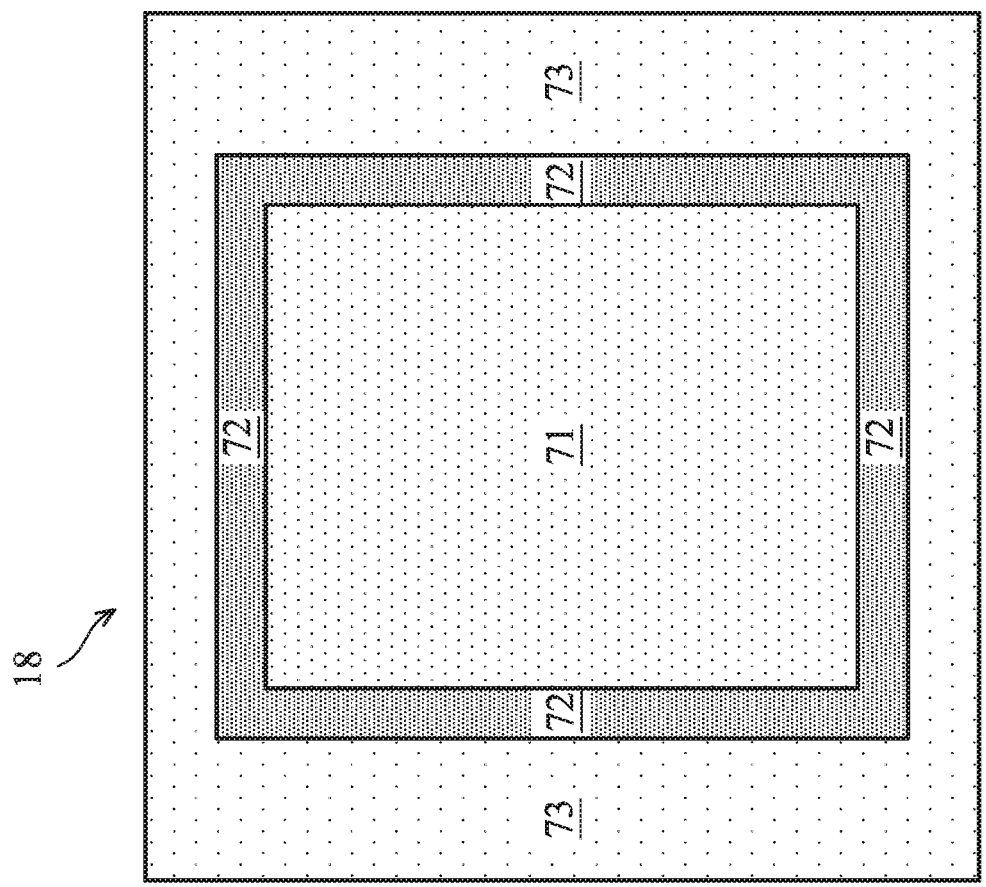

FIG. 29 illustrates a top view of an EUV mask 18 according to yet another embodiment of the present disclosure. The embodiment of FIG. 29 is similar to the embodiment of FIG. 27, except that the region 72 of the EUV mask 18 does not include trenches filled with vacuum, but rather includes a non-reflective material embedded in the ML structure, for example the non-reflective elements 250 discussed above. In some embodiments, the non-reflective material in the region 72 may include inter-diffused film pairs of the ML structure, which are formed in response to an application of laser beams. It is understood that the embedded non-reflective material may also extend through the capping layer and/or the buffer layer of the EUV mask 18.

Figure 30:
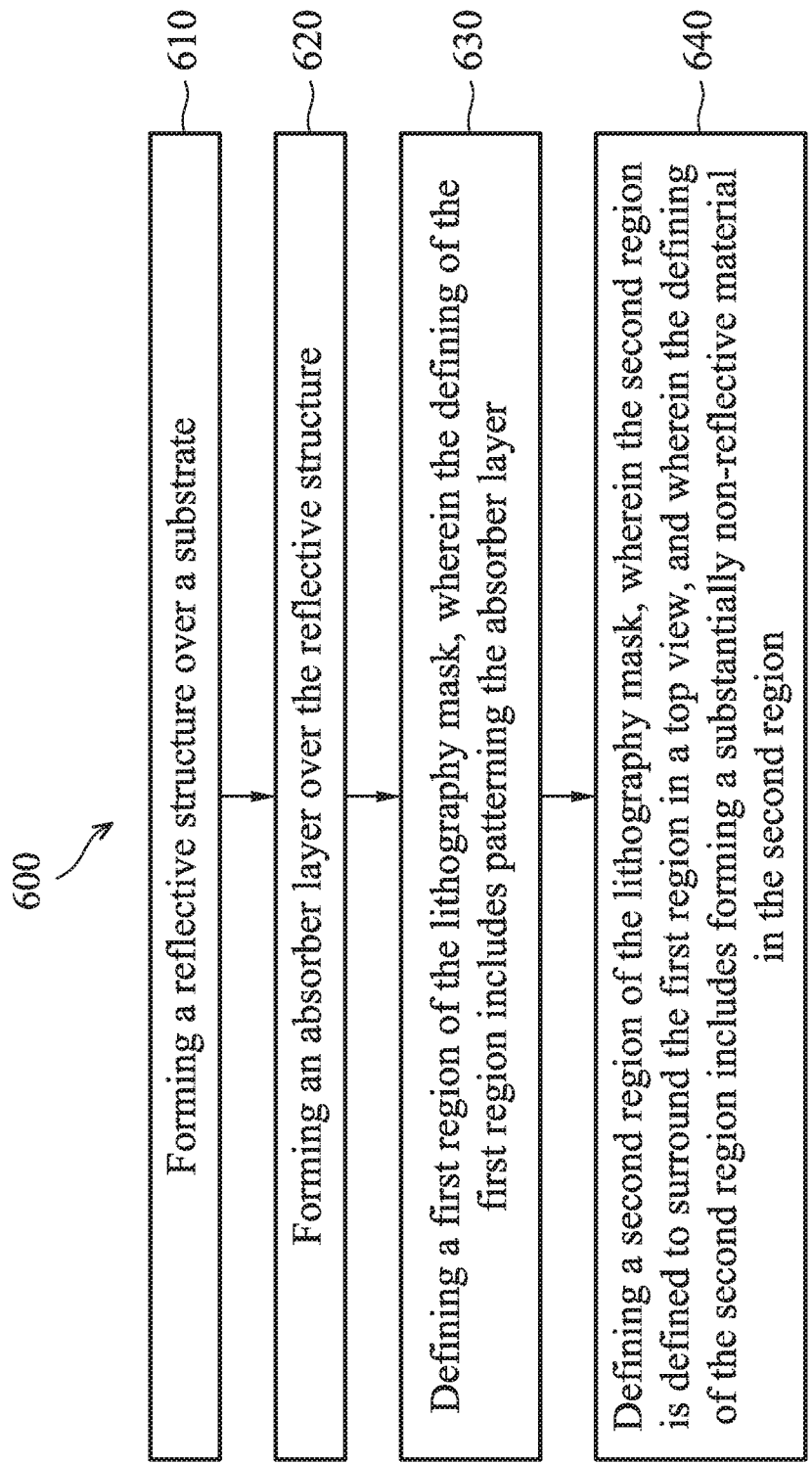
FIG. 30 is a flowchart illustrating a method of fabricating a lithography mask in accordance with some embodiments of the present disclosure.

FIG. 30 is a flowchart of a method 600 of performing a semiconductor fabrication process according to various aspects of the present disclosure.

The method 600 includes a step 610 of forming a reflective structure over a substrate. In some embodiments, the reflective structure includes a multilayer structure that is configured to provide a high reflectivity for a predefined radiation wavelength, for example a reflectivity above a predetermined threshold.

The method 600 includes a step 620 of forming an absorber layer over the reflective structure.

The method 600 includes a step 630 of defining a first region of the lithography mask, wherein the defining of the first region includes patterning the absorber layer.

The method 600 includes a step 640 of defining a second region of the lithography mask. The second region is defined to surround the first region in a top view, and the defining of the second region includes forming a substantially non-reflective material in the second region. In some embodiments, the forming of the substantially non-reflective material comprises forming a material that is substantially non-reflective with respect to the EUV light. In some embodiments, the defining of the second region comprises etching a trench in the second region, wherein the trench vertically extends through the reflective structure. In some embodiments, the method 600 further comprises: forming a passivation layer on sidewalls of the trench using an oxygen plasma process or a nitrogen plasma process. In some embodiments, the method 600 further comprises: forming a passivation layer on sidewalls of the trench using an ion implantation process. In some embodiments, the etching of the trench comprises etching the trench through the absorber layer. In some embodiments, the etching of the trench is performed using a focused ion beam (FIB). In some embodiments, the defining of the second region comprises applying a laser to a portion of the reflective structure in the second region. In some embodiments, the forming of the reflective structure comprises forming a plurality of first layers and a plurality of second layers that are interleaving with the first layers; and the applying of the laser is performed in a manner to cause inter-diffusion between the first layers and the second layers.

It is understood that additional processes may be performed before, during, or after the steps 610-640 of the method 600 to complete the fabrication of the lithography mask. For example, the lithography mask includes a third region that surrounds the second region in the top view, and the method 600 may further include a step of forming one or more bridges in the second region, wherein the one or more bridges interconnect the first region with the third region. For reasons of simplicity, additional steps are not discussed herein in detail.

Figure 31:
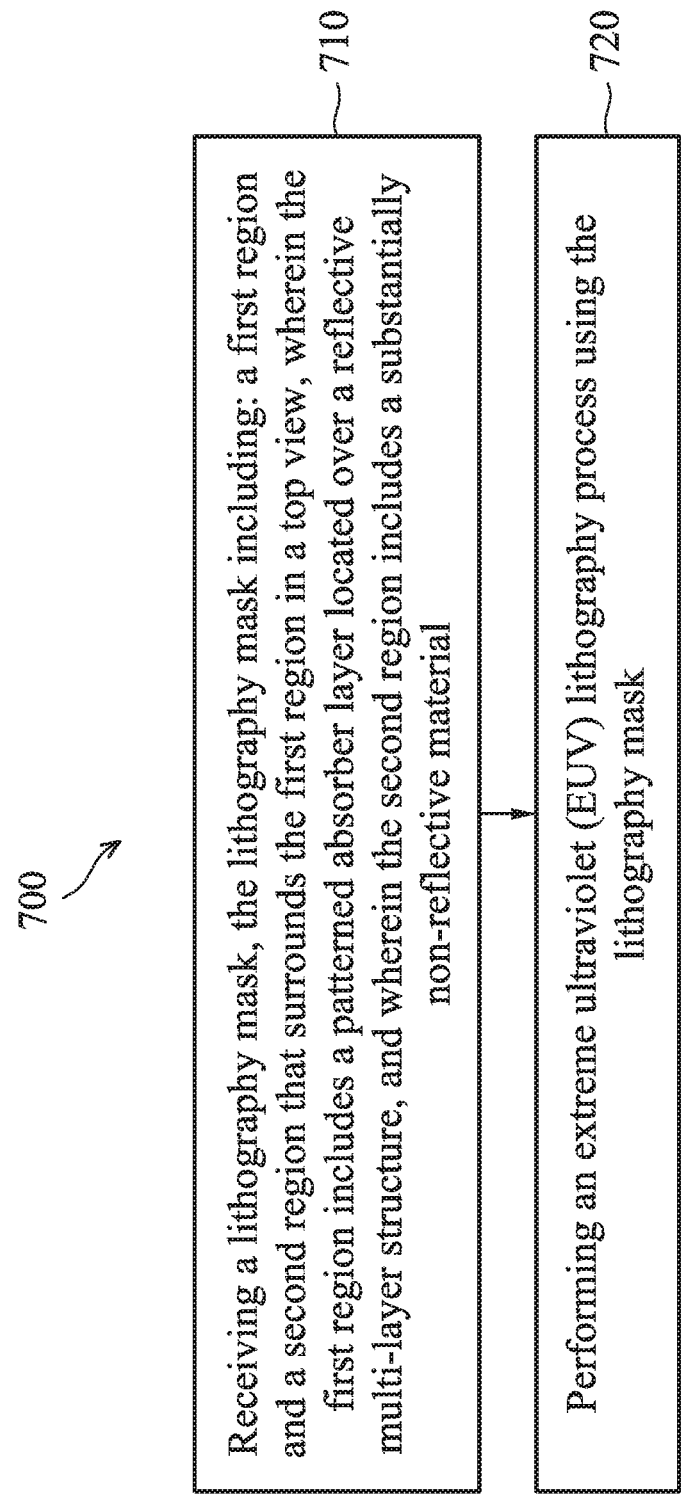
FIG. 31 is a flowchart illustrating a method of performing semiconductor fabrication using a lithography mask in accordance with some embodiments of the present disclosure.

FIG. 31 is a flowchart illustrating a method 700 of performing semiconductor fabrication using a lithography mask in accordance with some embodiments of the present disclosure.

The method 700 includes a step 710 of receiving a lithography mask. The lithography mask includes a first region and a second region that surrounds the first region in a top view. The first region includes a patterned absorber layer located over a reflective multi-layer structure. The second region includes a substantially non-reflective material.

The method 700 includes a step 720 of performing an extreme ultraviolet (EUV) lithography process using the lithography mask.

In some embodiments, the substantially non-reflective material includes a trench located in the reflective multi-layer structure, the trench is filled with vacuum and exposes the non-reflective LTEM substrate, and a passivation layer is located on surfaces of the trench.

In some embodiments, the reflective multi-layer structure includes a plurality of interleaving first layers and second layers, and the substantially non-reflective material includes an element embedded in the reflective multi-layer structure, the element containing inter-diffused first layers and second layers.

Based on the above discussions, it can be seen that the EUV mask of the present disclosure offers advantages over conventional EUV masks. It is understood, however, that other embodiments may offer additional advantages, and not all advantages are necessarily disclosed herein, and that no particular advantage is required for all embodiments. One advantage is that the EUV mask of the present disclosure can substantially alleviate the field-to-field interference issues that are associated with conventional EUV masks. For example, without the "black border" herein, the EUV mask may still have non-zero EUV reflectivity from the absorber layer at the edges of the main field region. The non-zero EUV reflectivity may lead to field-to-field interference, which adversely impacts the critical dimension performance during wafer printing. In the present disclosure, by forming a "black border" region—which may include vacuum-filled trenches (exposing the non-reflective LTEM substrate) or embedded inter-diffused film pairs as the non-reflective structure—the interference between the main fields is reduced. As a result, the present disclosure can achieve a reduction in the critical dimension error. Another advantage is that by forming passivation layers on the trench sidewalls in the "black border" region, the present disclosure reduces undesirable exposure of the EUV mask to contaminant particles, which may otherwise occur during a lithography process in which the EUV mask is used. Furthermore, the processes discussed herein to form the EUV mask are easy and inexpensive to implement and does not lead to substantially increased fabrication costs.

One aspect of the present disclosure pertains to a lithography mask. The lithography mask includes a substrate. A reflective structure is disposed over a first side of the substrate. A patterned absorber layer is disposed over the reflective structure. The lithography mask includes a first region and a second region that surrounds the first region in a top view. The patterned absorber layer is located in the first region. A substantially non-reflective material is located in the second region.

Another aspect of the present disclosure pertains to a method of fabricating a lithography mask. A reflective structure is formed over a substrate. An absorber layer is formed over the reflective structure. A first region of the lithography mask is defined. The defining of the first region includes patterning the absorber layer. A second region of the lithography mask is defined. The second region is defined to surround the first region in a top view. The defining of the second region includes forming a substantially non-reflective material in the second region.

Yet another aspect of the present disclosure pertains to a system of performing a lithography process. A lithography mask is received. The lithography mask includes: a first region and a second region that surrounds the first region in a top view. The first region includes a patterned absorber layer located over a reflective multi-layer structure. The second region includes a substantially non-reflective material. An extreme ultraviolet (EUV) lithography process is performed using the lithography mask.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a lithography mask, comprising:
   forming a reflective structure over a first side of a substrate;
   forming an absorber layer over the reflective structure;
   defining a first region of the lithography mask, wherein the defining of the first region includes patterning the absorber layer;
   defining a second region of the lithography mask, wherein the second region is defined to surround the first region in a top view, and wherein the defining of the second region includes forming a substantially non-reflective material in the second region at least in part by applying a laser, from a second side of the substrate opposite the first side, to a portion of the reflective structure in the second region; and
   after the laser has been applied, forming a conductive layer on the second side of the substrate.

2. The method of claim 1, wherein:
   the forming of the reflective structure comprises forming a structure that reflects extreme ultraviolet (EUV) light; and
   the forming of the substantially non-reflective material comprises forming a material that is substantially non-reflective with respect to the EUV light.

3. The method of claim 1, wherein the laser is applied through the substrate.

4. The method of claim 3, wherein:
   the forming of the reflective structure comprises forming a plurality of first layers and a plurality of second layers that are interleaving with the first layers; and
   the applying of the laser is performed in a manner to cause inter-diffusion between the first layers and the second layers.

5. The method of claim 1, wherein the lithography mask includes a third region that surrounds the second region in the top view, and wherein the method further comprises: forming one or more bridges in the second region, wherein the one or more bridges interconnect the first region with the third region.

6. A method of performing a lithography process, comprising:
   providing a lithography mask that includes a first region and a second region that surrounds the first region in a top view, wherein the first region includes a patterned absorber layer formed over a reflective multi-layer structure, the reflective multi-layer structure being formed over a front side of the lithography mask;

forming a substantially non-reflective material in the second region at least in part by applying a laser from a back side of the lithography mask;

after the laser has been applied, forming a conductive layer on the back side of the lithography mask; and performing an extreme ultraviolet (EUV) lithography process using the lithography mask, wherein the EUV lithography process is performed in an environment that contains hydrogen.

7. The method of claim 6, wherein:

the substantially non-reflective material includes a trench located in the reflective multi-layer structure; and a passivation layer is located on surfaces of the trench.

8. The method of claim 6, wherein:

the reflective multi-layer structure includes a plurality of interleaving first layers and second layers; and the substantially non-reflective material includes an element embedded in the reflective multi-layer structure, the element containing inter-diffused first layers and second layers.

9. The method of claim 6, wherein the EUV lithography process is performed using a step-and-scan tool that contains a hydrogen gas.

10. A method, comprising:

obtaining a lithography mask that includes a first region and a second region that surrounds the first region in a top view, wherein a patterned absorber layer is located in the first region over a first side of a substrate;

applying a laser from a second side of the substrate opposite the first side, thereby forming a substantially non-reflective material in the second region;

forming a conductive layer over the second side of the substrate after the applying of the laser; and performing a lithography process using the lithography mask.

11. The method of claim 10, wherein the performing the lithography process comprises performing an extreme ultraviolet (EUV) lithography process, wherein the substantially non-reflective material is substantially non-reflective with respect to EUV radiation.

12. The method of claim 10, wherein the patterned absorber layer is disposed over a reflective structure that is reflective with respect to extreme ultraviolet (EUV) radiation.

13. The method of claim 12, wherein the substantially non-reflective material includes a trench that vertically extends through the reflective structure, wherein a passivation material is disposed on sidewalls of the trench.

14. The method of claim 12, wherein:

the reflective structure includes a plurality of first layers interleaved with a plurality of second layers; and the substantially non-reflective material includes an inter-diffused structure of the first layers and the second layers.

15. The method of claim 10, wherein:

the lithography mask further includes a third region that surrounds the second region in the top view; and the first region and the third region are electrically interconnected by one or more bridges located in the second region.

16. The method of claim 10, wherein the lithography process is performed in an environment that contains hydrogen.

17. The method of claim 16, further comprising:

etching a trench in the second region; and after the etching of the trench, forming a passivation layer on side surfaces of the trench.

18. The method of claim 17, wherein the forming of the passivation layer comprises applying a plasma process using a same chamber in which the etching of the trench is performed.

19. The method of claim 17, wherein the forming of the passivation layer comprises applying an ion implantation process at a tilt angle between about 10 degrees and about 75 degrees.

20. The method of claim 10, wherein the forming the conductive layer comprises forming a chromium nitride layer as the conductive layer.

* * * * *